(12) United States Patent
Laval et al.

(10) Patent No.: US 10,965,124 B2
(45) Date of Patent: *Mar. 30, 2021

(54) APPARATUSES INCLUDING POWER ELECTRONICS CIRCUITRY, AND RELATED METHODS OF OPERATION

(71) Applicants: Duke Energy Corporation, Charlotte, NC (US); The University of North Carolina at Charlotte, Charlotte, NC (US)

(72) Inventors: Stuart Laval, Fort Mill, SC (US); Aleksandar Vukojevic, Harrisburg, NC (US); Somasundaram Essakiappan, Charlotte, NC (US); Madhav Manjrekar, Cary, NC (US); Ehab Shoubaki, Davidson, NC (US)

(73) Assignees: DUKE ENERGY CORPORATION, Charlotte, NC (US); THE UNIVERSITY OF NORTH CAROLINA AT CHARLOTTE, Charlotte, NC (US)

(*) Notice: Subject to any disclaimer, the term of this patent is extended or adjusted under 35 U.S.C. 154(b) by 146 days.

This patent is subject to a terminal disclaimer.

(21) Appl. No.: 15/881,317

(22) Filed: Jan. 26, 2018

(65) Prior Publication Data

US 2018/0219381 A1    Aug. 2, 2018

Related U.S. Application Data

(60) Provisional application No. 62/527,715, filed on Jun. 30, 2017, provisional application No. 62/451,174, filed on Jan. 27, 2017.

(51) Int. Cl.
*H02J 3/14* (2006.01)
*H02J 3/01* (2006.01)
(Continued)

(52) U.S. Cl.
CPC .............. *H02J 3/01* (2013.01); *G01R 22/061* (2013.01); *H02J 3/18* (2013.01); *H02J 3/1828* (2013.01);
(Continued)

(58) Field of Classification Search
CPC ........... H02J 3/38; H02J 3/383; Y02B 90/222; Y02E 70/30; Y02E 10/563; Y02E 10/566;
(Continued)

(56) References Cited

U.S. PATENT DOCUMENTS 6,281,601 B1* 8/2001 Edelman ............... H02J 3/1885
307/29
6,952,092 B2* 10/2005 Wood .................. H02M 1/4266
323/323
(Continued)

OTHER PUBLICATIONS

Gyugyi, Laszlo "Dynamic Compensation of AC Transmission Lines by Solid-State Synchronous Voltage Sources" *IEEE Transactions on Power Delivery* 9(2):904-911 (Apr. 1994).
(Continued)

*Primary Examiner* — Jared Fureman
*Assistant Examiner* — Esayas G Yeshaw
(74) *Attorney, Agent, or Firm* — Myers Bigel, P.A.

(57) ABSTRACT

Apparatuses including power electronics circuitry are provided. The power electronics circuitry includes at least one power converter that is coupled to a DC bus. Moreover, in some embodiments, the at least one power converter is configured to regulate a voltage of the DC bus. Related methods of operating an apparatus including power electronics circuitry are also provided.

23 Claims, 14 Drawing Sheets

(51) Int. Cl.
*H02J 3/18* (2006.01)
*G01R 22/06* (2006.01)
*H02J 5/00* (2016.01)
*H02J 3/32* (2006.01)
*H02J 3/38* (2006.01)
*H02M 7/66* (2006.01)
*H02J 13/00* (2006.01)

(52) U.S. Cl.
CPC ........ *H02J 3/32* (2013.01); *H02J 3/38* (2013.01); *H02J 3/381* (2013.01); *H02J 5/00* (2013.01); *H02J 3/14* (2013.01); *H02J 13/00* (2013.01); *H02J 13/00007* (2020.01); *H02J 13/00022* (2020.01); *H02J 13/0075* (2013.01); *H02J 13/0082* (2013.01); *H02J 13/0086* (2013.01); *H02J 2310/14* (2020.01); *H02M 7/66* (2013.01); *Y02B 70/30* (2013.01); *Y02B 90/20* (2013.01); *Y02E 10/56* (2013.01); *Y02E 40/30* (2013.01); *Y02E 40/40* (2013.01); *Y02E 40/70* (2013.01); *Y02E 70/30* (2013.01); *Y04S 10/123* (2013.01); *Y04S 20/12* (2013.01); *Y04S 20/242* (2013.01)

(58) Field of Classification Search
CPC ......... Y02E 40/30; Y02E 40/40; Y02E 40/72; Y04S 10/123; Y04S 20/12
See application file for complete search history.

(56) References Cited

U.S. PATENT DOCUMENTS

| | | | |
|---|---|---|---|
| 7,969,043 B2* | 6/2011 | Caraghiorghiopol | H02J 1/102 307/82 |
| 9,829,899 B2 | 11/2017 | Handley et al. | |
| 2012/0022713 A1* | 1/2012 | Deaver, Sr. | G05B 17/02 700/298 |
| 2012/0112713 A1* | 5/2012 | Kuehn | H02J 3/24 323/207 |
| 2013/0147275 A1* | 6/2013 | Bettenwort | H02J 3/381 307/43 |
| 2013/0201733 A1 | 8/2013 | Divan et al. | |
| 2014/0070756 A1 | 3/2014 | Kearns et al. | |
| 2014/0300185 A1 | 10/2014 | Buchstaller et al. | |
| 2015/0035371 A1 | 2/2015 | Ahmed et al. | |
| 2016/0043597 A1 | 2/2016 | Kuwahara | |
| 2016/0268806 A1* | 9/2016 | Chatterjee | H02M 7/44 |
| 2016/0308357 A1 | 10/2016 | Yuan | |
| 2017/0126010 A1* | 5/2017 | Canales | H02J 1/102 |
| 2017/0133879 A1* | 5/2017 | Eckhardt | H02J 3/386 |
| 2017/0160711 A1 | 6/2017 | Wong et al. | |
| 2017/0278199 A1* | 9/2017 | Wu | H02J 3/14 |
| 2018/0006461 A1 | 1/2018 | She et al. | |
| 2018/0191273 A1 | 7/2018 | Banfi et al. | |

OTHER PUBLICATIONS

Molinas et al. "Low Voltage Ride Through of Wind Farms With Cage Generators: STATCOM Versus SVC" *IEEE Transactions on Power Electronics* 23(3):1104-1117 (May 2008).

Mumtaz et al. "Harmonic incursion at the point of common coupling due to small grid-connected power stations" *Journal of Electrical Systems and Information Technology* 2(3):368-377 (Dec. 2015).

Noroozian et al. "Benefits of SVC and STATCOM for electric utility application" *2003 IEEE PES Transmission and Distribution Conference and Exposition* 3:1143-1150 (Sep. 2003).

Perera et al. "Point of Common Coupling (PCC) Voltage Control of a Grid-Connected Solar Photovoltaic (PV) System" *IECON 2013—39th Annual Conference of the IEEE Industrial Electronics Society* (pp. 7475-7480) (Nov. 2013).

Rao et al. STATCOM Control for Power System Voltage Control Applications *IEEE Transactions on Power Delivery* 15(4):1311-1317 (Oct. 2000).

Ronner, Beat "Harmonic voltage control with a STATCOM" *2009 13th European Conference on Power Electronics and Applications* (pp. 1-9) (Sep. 2009).

Roy et al. "D-STATCOM control in distribution networks with composite loads to ensure grid code compatible performance of photovoltaic generators" *2013 IEEE 8th Conference on Industrial Electronics and Applications (ICIEA)* (pp. 55-60) (Jun. 2013).

Sen et al. "Introduction to FACTS Controllers: Theory, Modeling, and Applications" (Abstract only) (Nov. 2009).

"Calculation of Power Loss (Synchronous)" Switching Regulator IC Series, Rohm Semiconductor (4 pages) (2016).

Keeping, Steven "Design Trade-offs when Selecting a High-Frequency Switching Regulator" Digi-Key Electronics (7 pages) (Feb. 24, 2015).

* cited by examiner

APPARATUSES INCLUDING POWER ELECTRONICS CIRCUITRY, AND RELATED METHODS OF OPERATION

RELATED APPLICATIONS

The present application claims the benefit of U.S. Provisional Patent Application No. 62/451,174, filed Jan. 27, 2017, and U.S. Provisional Patent Application No. 62/527,715, filed Jun. 30, 2017, the disclosures of which are hereby incorporated herein in their entirety by reference. Moreover, the present application is related to U.S. patent application Ser. No. 14/870,126, filed Sep. 30, 2015, now U.S. Pat. No. 9,829,899, the disclosure of which is hereby incorporated herein in its entirety by reference.

FIELD

The present disclosure relates to utility meters and power electronics.

BACKGROUND

High penetration of Distributed Energy Resources (DERs), especially at low-voltage networks may introduce power quality problems such as voltage sags and swells, and may exacerbate voltage harmonics on a grid. Conventionally, these negative effects of DERs were mitigated by centralized bulk devices at the medium-voltage level, such as at a plant or a substation. For example, static compensators (STATCOMs) and static VAR compensators (SVCs) may be provided at a central level to regulate line voltage through reactive power control. These semiconductor-based devices may actively regulate the reactive current injected into the grid and may provide faster and finer regulation than mechanically-switched voltage regulators such as Line Tap Changers (LTCs). These systems, however, may fall short of resolving problems arising at the leaf end of a distribution network due to massive DER penetration, especially in residential and commercial markets. For example, due to their centralized existence at the medium-voltage level, the visibility of such systems to problems locally occurring at low voltages may be limited. Also, as low-voltage distribution networks have smaller ratios of reactance to resistance (X/R ratios), the effectiveness of reactive current injection may be muted.

SVCs on a low-voltage network (μ-SVCs) may overcome some of the problems of centralized bulk devices at the medium-voltage level, as the distributed deployment of μ-SVCs may mitigate negative effects of DERs at the source, thus blocking their propagation to the medium-voltage network. μ-SVCs, however, may be bulky, may offer limited power control, and may fail to adequately compensate for grid voltage harmonics.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the present inventive concepts.

Various embodiments of the present inventive concepts include, an apparatus including a housing. The apparatus may include electric utility meter circuitry in the housing and configured to measure usage of electricity supplied by an electric utility to a premise of a customer of the electric utility. Moreover, the apparatus may include power electronics circuitry in the housing. The power electronics circuitry may include a dynamic Watt-VAR compensator including a grid interface switched mode power converter that is coupled to an AC bus and to a DC bus and that is configured to regulate a voltage of the DC bus.

In various embodiments, the grid interface switched mode power converter may include bidirectional power converter circuitry that is coupled to the AC bus and to the DC bus and that is configured to operate in both a power inverter mode and a power rectifier mode.

According to various embodiments, the apparatus may be a Premise Energy Router (PER) that includes the electric utility meter circuitry and the power electronics circuitry at or adjacent the premise of the customer. The PER may be downstream from a substation that serves the premise of the customer. The voltage of the DC bus that the grid interface switched mode power converter is configured to regulate may be 24 Volts to 2,000 Volts. Moreover, a switching frequency of the grid interface switched mode power converter may be 10 kilohertz or higher.

In various embodiments, the premise may be a residential premise of the customer, and a voltage of the AC bus that is coupled to the grid interface switched mode power converter may be 120 Volts, 208 Volts, or 240 Volts. The 120 Volts, 208 Volts, or 240 Volts may be a single-phase, split-phase, or three-phase voltage.

According to various embodiments, the DC bus may be in the apparatus and may be a shared DC bus that is coupled to a plurality of DC power generation and/or DC energy storage elements at the premise of the customer. The grid interface switched mode power converter may be configured to convert DC power received from the plurality of DC power generation and/or DC energy storage elements via the shared DC bus into AC power. Moreover, the grid interface switched mode power converter may be further configured to inject current to a Point of Common Coupling (PCC) that is between an AC grid to which the apparatus is coupled and a load of the premise of the customer. In some embodiments, the current may include a direct fundamental and harmonic current and a quadrature fundamental and harmonic current, and the PCC may be an AC PCC.

In various embodiments, the grid interface switched mode power converter may include single-phase, split-phase, or three-phase power bidirectional inverter-rectifier circuitry that is coupled to the shared DC bus. Moreover, the plurality of DC power generation and/or DC energy storage elements may be coupled to the shared DC bus via a plurality of switched mode power converters, respectively. In some embodiments, the plurality of DC power generation and/or DC energy storage elements may include a DC power generation element including a solar photovoltaic (PV) system or a fuel cell, and may include a DC energy storage element including a battery or a capacitor. In some embodiments, the plurality of switched mode power converters may include first and second DC-to-DC power converters that are coupled to the shared DC bus. The solar PV system or the fuel cell may be coupled to the first DC-to-DC power converter, and the battery or the capacitor may be coupled to the second DC-to-DC power converter.

According to various embodiments, the apparatus may be free of any mechanical circuit breaker and free of any step-up or step-down AC transformer. Additionally or alternatively, the apparatus may include a DC link capacitor, or a bank of capacitors, coupled to a battery energy storage system.

Various embodiments of the present inventive concepts include a method of operating an apparatus connected between a utility secondary service of an electric utility and a wiring connection of a customer at a premise of the customer. The method may include measuring, using electric utility meter circuitry of the apparatus, usage of electricity supplied by the electric utility to the premise of the customer. Moreover, the method may include regulating, using a grid interface switched mode power converter of power electronics circuitry of a dynamic Watt-VAR compensator of the apparatus, a voltage of a DC bus in the apparatus.

According to various embodiments, the DC bus may be a shared DC bus that is coupled to a plurality of DC power generation and/or DC energy storage elements at the premise of the customer. Moreover, the regulating may include operating a power inverter mode of the grid interface switched mode power converter, while the grid interface switched mode power converter is coupled to the shared DC bus and is shared by the plurality of DC power generation and/or DC energy storage elements. In some embodiments, the regulating may include operating a power rectifier mode of the grid interface switched mode power converter, while the grid interface switched mode power converter is coupled to the shared DC bus and is shared by the plurality of DC power generation and/or DC energy storage elements.

In various embodiments, the grid interface switched mode power converter may be coupled to an AC bus. The method may include detecting preexisting harmonics at an AC Point of Common Coupling (PCC), and determining harmonic current to inject to the AC PCC to compensate for the preexisting harmonics. In some embodiments, the measuring and the regulating may be performed while the apparatus is downstream from a substation that serves the premise of the customer and without using any step-up or step-down AC transformer in the apparatus. Moreover, the voltage of the DC bus may be 24 Volts to 2,000 Volts while performing the regulating, and a switching frequency of the grid interface switched mode power converter may be 10 kilohertz or higher while performing the regulating.

According to various embodiments, the premise may be a residential premise of the customer, and the measuring and the regulating may be performed while the apparatus is at or adjacent the residential premise of the customer. Additionally or alternatively, the regulating may include operating the grid interface switched mode power converter as a voltage source, while a plurality of switched mode power converters coupled to the DC bus operates in a current source mode or in a voltage source mode.

An apparatus, according to various embodiments of the present inventive concepts, may include power electronics circuitry therein. The power electronics circuitry may include a dynamic Watt-VAR compensator including bidirectional inverter-rectifier circuitry that is configured to inject current to an AC PCC. The power electronics circuitry may include a DC bus coupled to both a DC power generation system and a DC energy storage device at a premise of a customer of an electric utility. Moreover, a switching frequency of the power electronics circuitry may be 10 kilohertz or higher. In some embodiments, the apparatus may include electric utility meter circuitry therein that is configured to measure usage of electricity supplied by the electric utility to the premise of the customer.

Various embodiments of the present inventive concepts include a PER at or adjacent a premise of a customer of an electric utility. The PER may include a housing and a DC bus in the housing. Moreover, the PER may include a plurality of switched mode power converters in the housing, coupled to the DC bus, and configured to interface with a plurality of DERs, respectively, at the premise of the customer.

According to various embodiments, the plurality of DERs may include an energy storage device at the premise of the customer. The plurality of switched mode power converters may include an energy storage switched mode power converter coupled to the DC bus and to the energy storage device. Moreover, the energy storage switched mode power converter may be configured to insert synthetic inertia for a distribution grid to which the PER is coupled. In some embodiments, the energy storage device may be an ultracapacitor or a battery.

In various embodiments, the PER may include communications circuitry configured to provide communications, via a field message bus, between first and second ones of the plurality of switched mode power converters. Additionally or alternatively, the PER may include a grid interface switched mode power converter coupled to the DC bus. The grid interface switched mode power converter may be configured to adjust or hold a voltage of the DC bus. The grid interface switched mode power converter may be a power semiconductor device that is configured to switch at a frequency of 10 kilohertz or higher.

According to various embodiments, the PER may include DC meter circuitry configured to measure DC power, and AC meter circuitry configured to measure real and reactive AC power. Moreover, the PER may include a bidirectional switch coupled to a secondary side of a distribution transformer. Additionally or alternatively, the PER may include a bidirectional switch coupled to an AC side of a grid. In some embodiments, the PER may include a switched mode power converter coupled to an AC load.

Various embodiments of the present inventive concepts include a method of operating a PER at or adjacent a premise of a customer of an electric utility. The method may include regulating, via a control input, a voltage of a DC bus of the PER. Moreover, a plurality of switched mode power converters may be coupled to the DC bus and may be configured to interface with a plurality of DERs, respectively, at the premise of the customer.

According to various embodiments, the plurality of DERs may include an energy storage device at the premise of the customer. The plurality of switched mode power converters may include an energy storage switched mode power converter coupled to the DC bus and to the energy storage device. The control input may be a first control input, and the method may include providing a second control input to the energy storage switched mode power converter to insert synthetic inertia for a distribution grid to which the PER is coupled. In some embodiments, the providing the second control input may include controlling capacitor emulation via the energy storage switched mode power converter to insert the synthetic inertia.

In various embodiments, the method may include communicating, via a field message bus, between first and second ones of the plurality of switched mode power converters. Additionally or alternatively, the control input may include a command to a grid interface switched mode power converter of the PER that is coupled to the DC bus to adjust or hold the voltage of the DC bus. In some embodiments, the command may be provided in response to a detected AC voltage level. Moreover, the grid interface switched mode power converter may adjust or hold the voltage while operating at a switching frequency of 10 kilohertz or higher.

According to various embodiments, the method may include operating DC meter circuitry of the PER to measure DC power, and operating AC meter circuitry of the PER to measure real and reactive AC power. Additionally or alternatively, the control input may be a first control input, and the method may include providing a second control input to a switch to disconnect the PER from a secondary side of a distribution transformer.

In various embodiments, the control input may be a first control input, and the method may include providing a second control input to a switch to island the PER from an AC side of a grid. Additionally or alternatively, the regulating may include operating a grid interface switched mode power converter of the PER as a voltage source to regulate the voltage of the DC bus, while the plurality of switched mode power converters operates in a current source mode or in a voltage source mode.

According to various embodiments, the regulating may include operating a grid interface switched mode power converter of the PER to process current into and out of the DC bus, while an energy storage switched mode power converter of the plurality of switched mode power converters operates as a voltage source to regulate the voltage of the DC bus, Additionally or alternatively, the regulating may include providing a command to each of the plurality of switched mode power converters to operate in a voltage droop control mode.

It is noted that aspects of the present inventive concepts described with respect to one embodiment may be incorporated in a different embodiment although not specifically described relative thereto. That is, all embodiments and/or features of any embodiment can be combined in any way and/or combination. Applicant(s) reserve(s) the right to change any originally filed claim or file any new claim accordingly, including the right to be able to amend any originally filed claim to depend from and/or incorporate any feature of any other claim although not originally claimed in that manner. These and other objects and/or aspects of the present inventive concepts are explained in detail below.

BRIEF DESCRIPTION OF THE DRAWINGS

The accompanying drawings, which form a part of the specification, illustrate various embodiments of the present inventive concepts. The drawings and description together serve to fully explain embodiments of the present inventive concepts.

DETAILED DESCRIPTION

Various embodiments described herein may provide improved regulation of a Direct Current (DC) voltage at a DC bus and/or of Alternating Current (AC) power that is injected into or consumed from an AC grid. Such regulation may be performed at low voltages via a compact apparatus that is at or adjacent one or more DERs. In some embodiments, a plurality of the DERs may be coupled to the same DC bus and may share the same inverter, which is also coupled to the DC bus. Moreover, some embodiments may provide improved mitigation of harmonics at the AC grid.

Figure 1A:
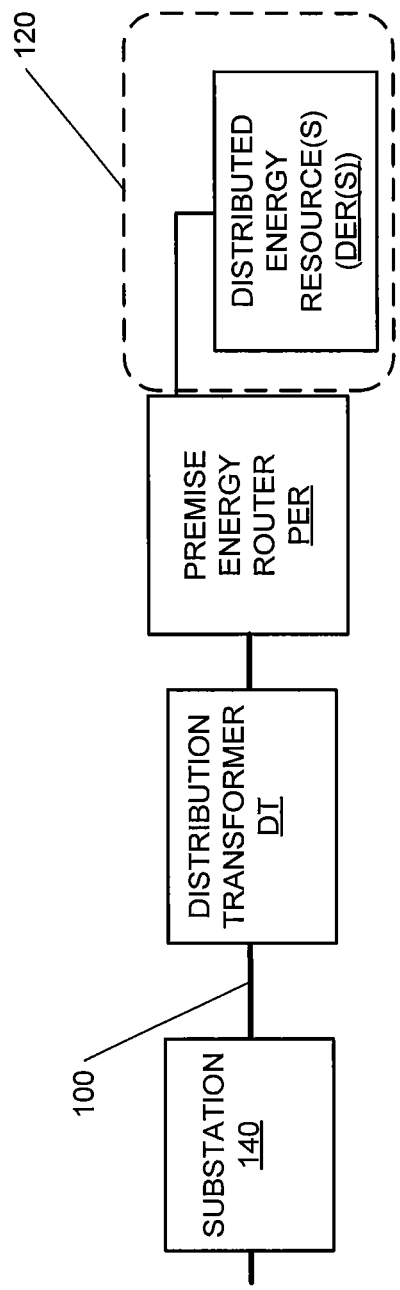
FIG. 1A is a schematic illustration of a premise energy router that is at or adjacent a premise of a customer of an electric utility, according to various embodiments.

Referring now to FIG. 1A, a schematic illustration is provided of a premise energy router PER that is at or adjacent a premise 120 of a customer of an electric utility, according to various embodiments. For example, the customer premise 120 may be a house, apartment, office, or other building, location, or structure, for which an electric utility meter could be provided for the customer. A customer premise 120 may thus be a structure such as a billboard, as well as a home or a business. Accordingly, the term "premise," as used herein, may be interchangeable with the term "premises," in that either term may be used herein to refer to a building, part of a building, or other structure for which an electric utility meter may be provided.

The premise energy router PER may be configured to interface with one or more distributed energy resources DER at the customer premise 120. For example, the premise energy router PER may be configured to interface with a solar photovoltaic (PV) system, a fuel cell, an energy storage system, or an Electric Vehicle (EV) charging station.

The premise energy router PER may provide electricity from an electric grid 100 to at least one device or appliance that is at the customer premise 120, and may measure electricity usage at the customer premise 120. For example, at least one appliance may be at the customer premise 120 and be powered by the electric grid 100 through the premise energy router PER. An appliance may be a refrigerator, dishwasher, laundry machine, oven, or any other large machine that uses electricity to perform, for example, cooking, cleaning, or food preservation functions in a household, institutional, commercial, or industrial setting.

Additionally or alternatively to appliances, various devices that use electricity may be at the customer premise 120 and may be connected to the premise energy router PER. For example, consumer electronics and heating/cooling devices and/or systems may be at the customer premise 120. Moreover, in some embodiments, the customer premise 120 may be a billboard, and the electric grid 100 may provide power for lights or an electronic display of the billboard.

The premise energy router PER is downstream from an electric utility substation 140 that serves the customer premise 120. The substation 140 may include one or more transformers. Between the substation 140 and the premise energy router PER is a distribution transformer DT, which may control a voltage level of power that is transmitted to the premise energy router PER. In particular, the distribution transformer DT serves the customer premise 120 and may be the closest transformer of the electric grid 100 to the customer premise 120. The distribution transformer DT may be underground, mounted on a concrete pad, mounted on a utility pole, or otherwise fixed at a location that is upstream and spaced apart from the premise energy router PER.

A single distribution transformer DT may provide power to one or more customers in a given area. For example, in an urban area, a plurality of homes may be fed off of a single distribution transformer DT. Rural distribution, on the other hand, may use one distribution transformer DT per customer. Moreover, a large commercial or industrial complex may rely on multiple distribution transformers DT.

A distribution transformer DT has a low-voltage secondary (e.g., output) side that distributes power to one or more customers. For example, in the United States, the low-voltage secondary side of the distribution transformer DT may be configured for a 240/120-Volt system, and three wires (including one neutral wire) may be fed from the low-voltage secondary side to the premise energy router PER.

Figure 1B:
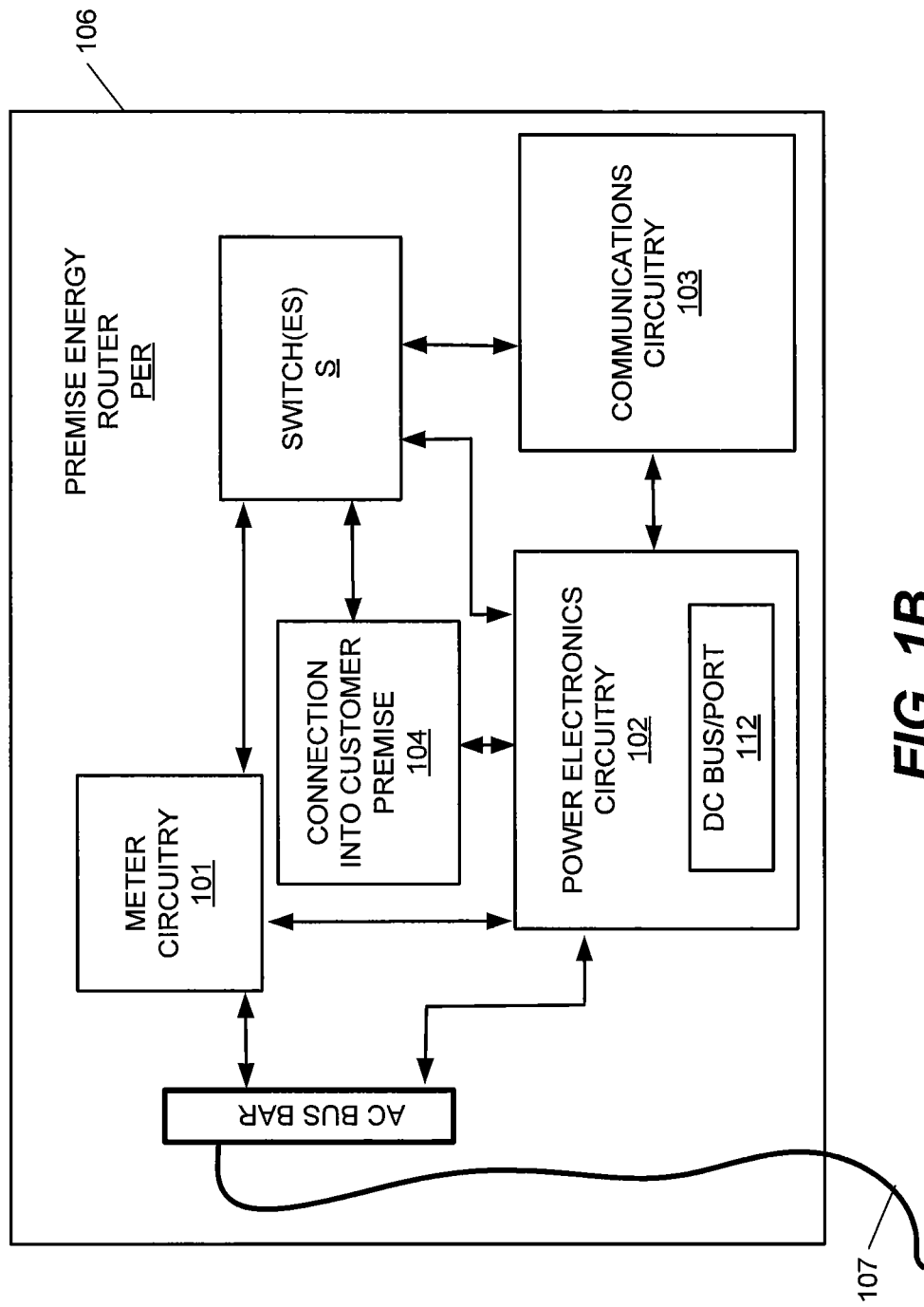
FIG. 1B is a block diagram of a premise energy router, according to various embodiments.

Referring now to FIG. 1B, a block diagram is provided of a premise energy router PER, according to various embodiments. A low-voltage secondary service connection 107 of the distribution transformer DT is input to the premise energy router PER. Although the low-voltage secondary service connection 107 is illustrated as a single wire for convenience, the inventive entity appreciates that three wires (including one neutral wire) may be used. In some embodiments, the low-voltage secondary service connection 107 may be configured for a 240/120-Volt system, and may be input to electric utility meter circuitry 101 of the premise energy router PER. Moreover, in some embodiments, the customer premise 120 may be a commercial or industrial customer premise, and the low-voltage secondary service connection 107 may use a higher voltage than 240 Volts (e.g., 277/480 Volts, for commercial/industrial applications). Accordingly, although the premise energy router PER may be a single-phase device for residential applications, the inventive entity appreciates that the premise energy router PER may optionally be used at higher voltages than 120/240 Volts for three-phase applications. Moreover, in some embodiments, the premise energy router PER may use split-phase voltages.

The electric utility meter circuitry 101 of the premise energy router PER includes hardware and/or software configured to perform the functionality of an electric utility meter. Accordingly, the premise energy router PER may replace an electric utility meter. As an example, the customer premise 120 may be a house of a customer, and the premise energy router PER may be mounted on the side of the house to replace an electric utility meter that had been mounted on the side of the house. The electric utility meter circuitry 101 of the premise energy router PER may thus be configured to measure electricity usage (e.g., to measure AC and/or DC usage in kilowatt-hours (kWh)) by the customer at the customer premise 120. In particular, the usage measured may be usage of electricity that is supplied by a specific electric utility (e.g., the electric utility that owns the premise energy router PER) to the customer premise 120.

As the premise energy router PER may be an utility-owned device rather than a customer-owned device, it may be separate from a breaker box/load center and may provide more access/control to the electric utility that owns it than would a customer-owned device. In some embodiments, however, the premise energy router PER may optionally be used as a circuit breaker. Moreover, the premise energy router PER, which may be on the outside of a customer's home, may be separate from coaxial lines to the home. Additionally or alternatively, the premise energy router PER may be used as a PV inverter and/or a battery charger, and may thus replace an existing PV inverter or battery charger at the customer premise 120. In some embodiments, when the premise energy router PER is operating in an inverter mode for PVs, a user may change the mode of operation (e.g., among modes such as maximum generation limit function, fixed power factor, intelligent Volt-VAR function, Volt-Watt function, frequency-Watt function, etc.).

Referring still to FIG. 1B, the premise energy router PER includes power electronics circuitry 102 and communications circuitry 103. For example, the power electronics circuitry 102 may use 120/240 Volts provided from the distribution transformer DT by the low-voltage secondary service connection 107. In particular, the power electronics circuitry 102 may be low-voltage power electronics circuitry that uses 600 Volts or lower, including 120/240 Volts (as well as 208, 277, 480, or 600 Volts, for example). The inventive entity appreciates that the voltage regulated may be AC and/or DC. Moreover, in some embodiments, the electric utility meter circuitry 101 may be referred to as meter metrology, and the electric utility meter circuitry 101 and/or the power electronics circuitry 102 may be configured to measure phasor measurement units and/or voltage levels, to perform waveform pattern recognition, to monitor AC and DC load behavior, to perform condition-based maintenance and risk assessment of assets, and/or to provide time-synchronization functionality. For example, the electric utility meter circuitry 101 and/or the power electronics circuitry 102 may be configured to provide a synchrophasor that measures high order harmonics, provides a clean waveform, and/or re-synchronizes to an AC line. Additionally or alternatively, the power electronics circuitry 102 may be configured to regulate gain, power factor, voltage harmonic levels, and current harmonic levels, and/or to provide a DC power source. For example, the power electronics circuitry 102 may be configured to cancel current and voltage harmonics, and/or to balance phases.

In one example, the power electronics circuitry 102 may be configured to regulate a voltage level of 600 Volts or lower that is provided to the customer premise 120 via a connection 104. For embodiments in which the customer premise 120 is a home of the customer, the load at the connection 104 may be between 0 Volt-Amperes and 15,000 Volt-Amperes. Accordingly, the electric utility meter circuitry 101 may, in some embodiments, be configured to operate with a load from the customer premise 120 of between 0 Volt-Amperes and 15,000 Volt-Amperes. In other words, the power rating for the premise energy router PER may range from 0 Volt-Amperes to 15,000 Volt-Amperes. In some higher-power embodiments (e.g., three-phase applications), however, the range may extend above 15,000 Volt-Amperes. Also, the load current may be sinusoidal, 60 Hertz. In general, in comparison with the premise energy router PER, the substation 140 and the distribution transformer DT may handle much larger loads (e.g., 50,000 Volt-Amperes or higher).

Moreover, in some embodiments, the power electronics circuitry 102 may include a DC bus 112, which may also be referred to as a DC port. The DC bus 112 may be configured to provide a DC power source to the customer premise 120. For example, the DC bus 112 may be a 400-Volt DC bus. As another example, the DC bus 112 may be a 1,000-Volt DC bus. The inventive entity appreciates, however, that the DC bus 112 may provide a DC voltage output anywhere in the range of 24-2,000 Volts. In some embodiments, the power electronics circuitry 102 may include power output circuitry connected to the DC bus 112 and configured to convert a DC output of a PV solar panel into a utility frequency AC that can be fed into a commercial electrical grid (e.g., the electric grid 100) or used by a local, off-grid electrical network. The inventive entity appreciates that the DC bus 112 may optionally provide a plurality of DC ports (e.g., a plurality of DC ports providing different DC voltage levels). In other words, although FIG. 1B illustrates one DC bus 112, a plurality of DC buses 112 may optionally be included in the premise energy router PER. Moreover, the inventive entity appreciates that the DC bus 112 may include a plurality of stages, including an AC/DC stage, a DC/DC stage, and/or a DC/AC stage.

Additionally or alternatively, the power electronics circuitry 102 may be configured to convert AC power received from the low-voltage secondary service connection 107 into DC power and to provide the DC power to one or more DC devices via the DC bus 112. In some embodiments, the power electronics circuitry 102 may include circuitry configured to provide both (i) AC-to-DC rectifier functionality (e.g., for converting AC into DC and providing DC from the DC bus 112 to a DC load) and (ii) DC-to-AC inverter functionality (e.g., for converting DC from a solar device or a battery storage into AC). Moreover, in some embodiments, the power electronics circuitry 102 of the premise energy router PER may include a DC-to-DC converter (or a plurality of DC-to-DC converters) that reduces the 400 Volts to a lower DC voltage level that can be provided into the customer's home. The DC-to-DC converter may have level-shift capability and/or may be a buck-boost converter. Additionally or alternatively, hardware of the power electronics circuitry 102 that performs inverter functionality may be configured to provide voltage and/or current source modes, and/or to provide either an isolated power supply or a non-isolated power supply.

The premise energy router PER may also include one or more switches S, which may help to reduce the impact to a customer of a problem with the power electronics circuitry 102 or of a problem with the electric grid 100. For example, the power electronics circuitry 102 may sense an open neutral situation (or any other power anomaly/error) and responsively trigger a switch S. In some embodiments, a switch S may keep the customer from losing power. The components of the premise energy router PER that are illustrated in FIG. 1B may each be internal to a housing 106 (e.g., a metal and/or plastic housing) of the premise energy router PER. Accordingly, the components of the premise energy router PER may be at the same location, in the same physical box/unit.

Figure 1C:
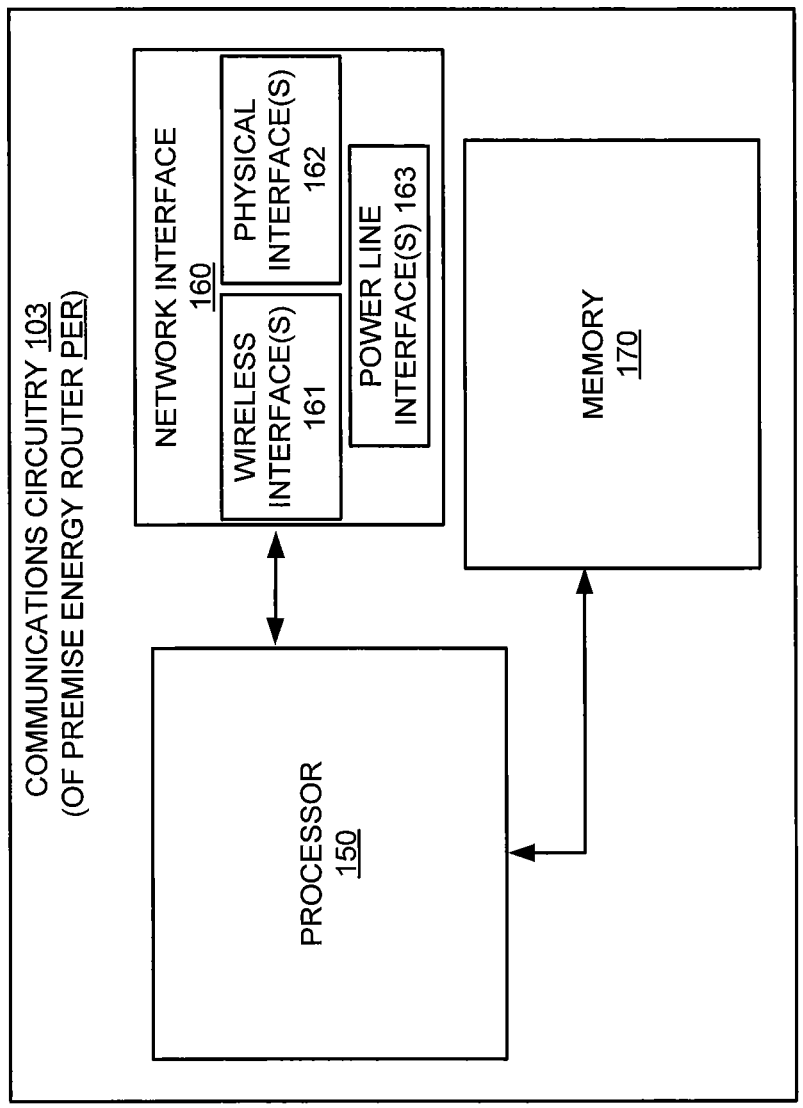
FIG. 1C is a block diagram of communications circuitry of a premise energy router, according to various embodiments.

Referring now to FIG. 1C, a block diagram is provided of the communications circuitry 103 of the premise energy router PER of FIGS. 1A and 1B, according to various embodiments. The communications circuitry 103 may include a processor 150, a network interface 160, and a memory 170. The processor 150 may be coupled to the network interface 160. The processor 150 may be configured to communicate with devices (e.g., communication nodes) at the customer premise 120, at the substation 140, and/or at an electric utility data center via the network interface 160. Additionally or alternatively, the processor 150 may control communications between different components of the power electronics circuitry 102. Such communications may be coordinated by a field message bus. For example, the following patent applications, the entire disclosures of which are hereby incorporated by reference, discuss a field message bus: U.S. patent application Ser. No. 14/264,757, filed on Apr. 29, 2014, and published as U.S. Patent Application Publication No. 2015/0097694, entitled Methods of Processing Data Corresponding to a Device that Corresponds to a Gas, Water, or Electric Grid, and Related Devices and Computer Program Products, and U.S. patent application Ser. No. 14/270,914, filed on May 6, 2014, now U.S. Pat. No. 9,722,665, entitled Communication Nodes and Sensor Devices Configured to Use Power Line Communication Signals, and Related Methods of Operation.

The network interface 160 may include, for example, one or more wireless interfaces 161 (e.g., 3G/LTE, other cellular, WiFi, Global Positioning System (GPS) interfaces, etc.) and one or more physical interfaces 162 (e.g., Ethernet, serial, USB interfaces, etc.). Moreover, the network interface 160 may optionally include one or more power line interfaces 163 (e.g., Low Voltage (LV) or Mid Voltage (MV) PLC).

Accordingly, the premise energy router PER may, in some embodiments, have multiple integrated communications options. For example, the premise energy router PER may provide PLC, WiFi, Zigbee, Z-wave communications, or other communications via the network interface 160 into the customer premise 120 (e.g., a customer's home), and may provide cellular communications or other communications to the electric grid 100. As an example, the premise energy router PER may communicate with smart appliances and demand response devices (e.g., devices that reduce load by turning off appliances, air conditioning, etc.) at the customer premise 120. By sharing data from inside the customer premise 120 with the premise energy router PER, the customer can improve the efficiency of power delivery by the premise energy router PER. In some embodiments, the premise energy router PER may optionally be used to control smart devices at the customer premise 120, and may thus reduce the total energy consumption at the customer premise 120.

Moreover, the premise energy router PER may have a modular design that allows the premise energy router PER to use a variety of communications technologies, and to therefore not be limited exclusively to one communications technology, such as PLC communications. The premise energy router PER may be referred to as having a modular design because the meter circuitry 101, the power electronics circuitry 102, and/or the communications circuitry 103 may be integrated circuits provided on respective plug-and-play cards that can be easily added to and removed from (e.g., removed and replaced with a new and/or different card providing improved/different functionality). As an example, the communications circuitry 103 may include a PLC card that may be replaced with or supplemented by a card that provides WiFi communications. Various other types of cards may also be used, including voltage inverter/rectifier cards, among other types of cards that are modular/interchangeable from one premise energy router PER to the next.

Referring still to FIG. 1C, the memory 170 may be coupled to the processor 150. The memory 170 may also store instructions/algorithms used by the processor 150. For example, the memory 170 of the premise energy router PER may include one or more algorithms that improve/optimize power flow to the customer premise 120. Using such algorithms, the premise energy router PER may maintain a data log/history for the meter circuitry 101, the power electronics circuitry 102, and/or the communications circuitry 103. Moreover, the premise energy router PER may use such algorithms to enable an override of predetermined set points, such as to enable an override of a 120/240 Volt set point to thereby reduce the output voltage below 120/240 Volts. Additionally or alternatively, the premise energy router PER may use such algorithms to provide notification of power/communications errors and notification of use of a switch S.

The communications circuitry 103 may include core hardware components such as a power supply, 10 MHz or higher speed processor(s), and 1 Megabyte (MB) or more of RAM. Because a premise energy router PER includes integrated processor 150 and memory 170 capability, the premise energy router PER can move/adjust voltage levels, VARs, etc. The integrated processor 150 and memory 170 capability may be referred to as an integrated distributed intelligence platform. Although the processor 150 is illustrated as being part of the communications circuitry 103, the premise energy router PER may include one or more processors 150 that are outside of the communications circuitry 103. For example, the meter circuitry 101 and/or the power electronics circuitry 102 may operate under the control of one or more processors 150 that is/are inside the housing 106 of the premise energy router PER but not necessarily inside the communications circuitry 103.

The communications circuitry 103 may include core applications, such as CPU/memory/OS management applications, port/device drivers, router/Internet Protocol (IP) services, network management services, basic protocol support, SCADA, custom Application Programming Interface (API)/applications, and device security services. Moreover, the communications circuitry 103 may include virtual applications, such as a virtual machine (e.g., a Java Virtual Machine), message bus(es), message broker(s), protocol adapters, mini-SCADA, open-standards API, and third-party applications (e.g., security/analytics applications). For example, the communications circuitry 103 may support Distributed Network Protocol (DNP) (e.g., DNP 3.0), Modbus, and Message Queue Telemetry Transport (MQTT) protocols. The core applications may use such software as C++/Linux, and the virtual applications may use such software as Java/Linux.

Figure 1D:
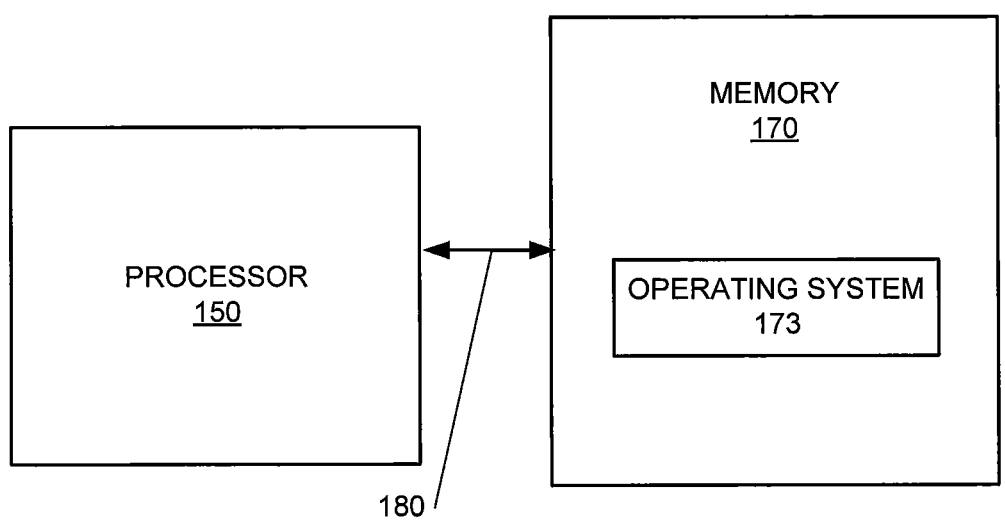
FIG. 1D is a block diagram that illustrates details of an example processor and memory that may be used in accordance with various embodiments.

Referring now to FIG. 1D, a block diagram is provided that illustrates details of an example processor 150 and memory 170 of the communications circuitry 103 that may be used in accordance with various embodiments. The processor 150 communicates with the memory 170 via an address/data bus 180. The processor 150 may be, for example, a commercially available or custom microprocessor. Moreover, the processor 150 may include multiple processors. The memory 170 is representative of the overall hierarchy of memory devices containing the software and data used to implement various functions of the communications circuitry 103 or other circuitry of the premise energy router PER as described herein. The memory 170 may include, but is not limited to, the following types of devices: cache, ROM, PROM, EPROM, EEPROM, flash, Static RAM (SRAM), and Dynamic RAM (DRAM).

As shown in FIG. 1D, the memory 170 may hold various categories of software and data, such as an operating system 173. The operating system 173 controls operations of the communications circuitry 103 or other circuitry of the premise energy router PER, such as the power electronics circuitry 102. In particular, the operating system 173 may manage the resources of the communications circuitry 103 or other circuitry of the premise energy router PER and may coordinate execution of various programs by the processor 150.

Figure 1E:
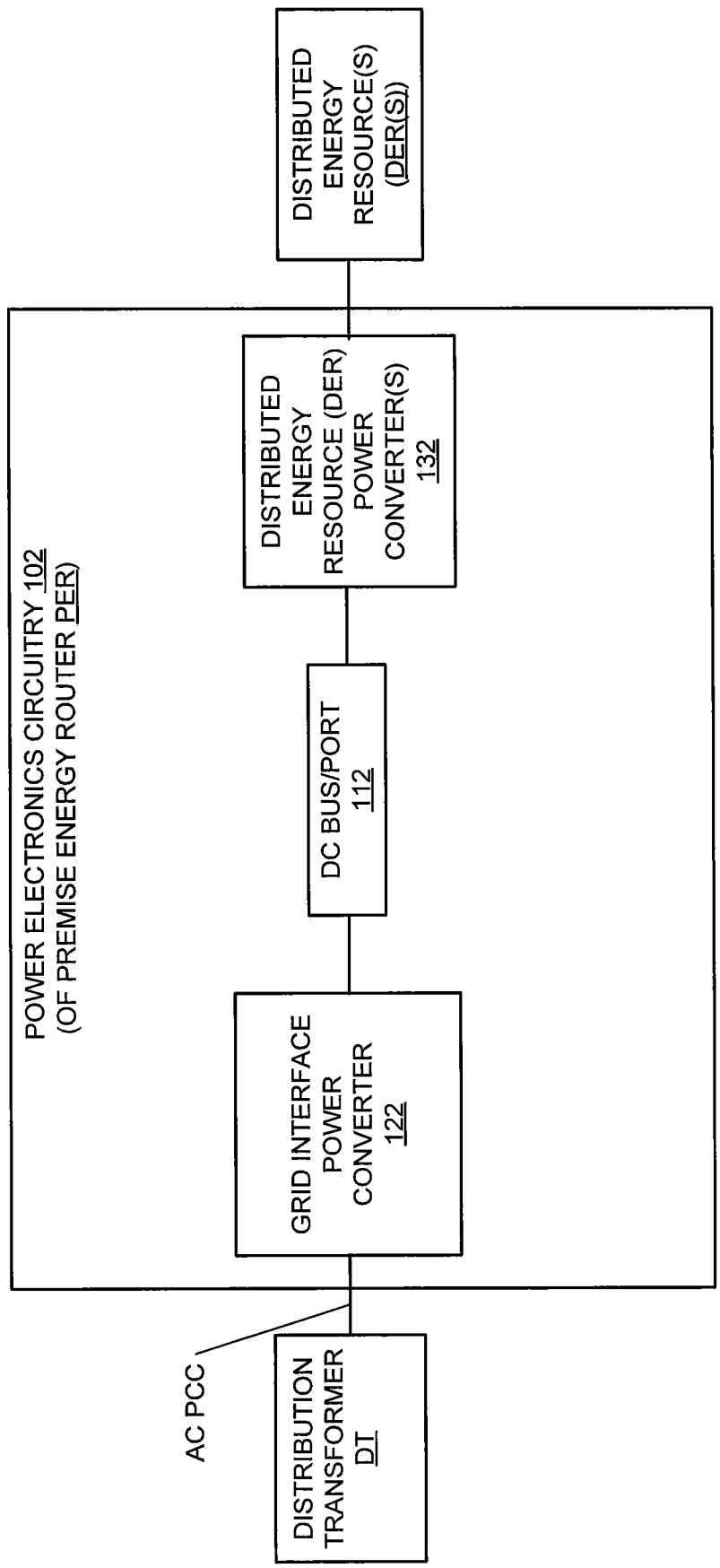
FIG. 1E is a block diagram of power electronics circuitry of a premise energy router, according to various embodiments.

Referring now to FIG. 1E, a block diagram is provided that illustrates details of power electronics circuitry 102 of the premise energy router PER. In addition to the DC bus 112, the power electronics circuitry 102 may include a grid interface power converter 122 that is coupled to the DC bus 112 and to an AC bus. The AC bus is illustrated in FIG. 1E by an AC Point of Common Coupling (PCC) that is between the premise energy router PER and a distribution transformer DT. For embodiments in which the customer premise 120 is a residential premise, a voltage of the AC bus may be between about 120 Volts and about 240 Volts. For example, the voltage of the AC bus may be 120 Volts, 208 Volts, or 240 Volts.

The grid interface power converter 122 may be configured to regulate a voltage of the DC bus 112. The voltage, which the grid interface power converter 122 may be configured to adjust or to hold constant, may be between about 24 Volts and about 2,000 Volts. For example, when the customer premise 120 is a residential premise, the DC voltage at the DC bus 112 may be 100-600 Volts. In another example, the DC voltage at the DC bus 112 may be 500-1,500 Volts. Moreover, the grid interface power converter 122 may be a switched mode power converter and may have a switching frequency of 10 kilohertz or higher.

The power electronics circuitry 102 may also include one or more DER power converters 132 that are coupled to the DC bus 112. Each DER power converter 132 may be a DC-to-DC power converter that is configured to interface with a respective distributed energy resource DER that is at the customer premise 120. Generally speaking, a DC-to-DC power converter facilitates power flow between two different/disparate DC voltage levels. Like the grid interface power converter 122, each DER power converter 132 may be a switched mode power converter having a switching frequency of 10 kilohertz or higher.

Figure 1F:
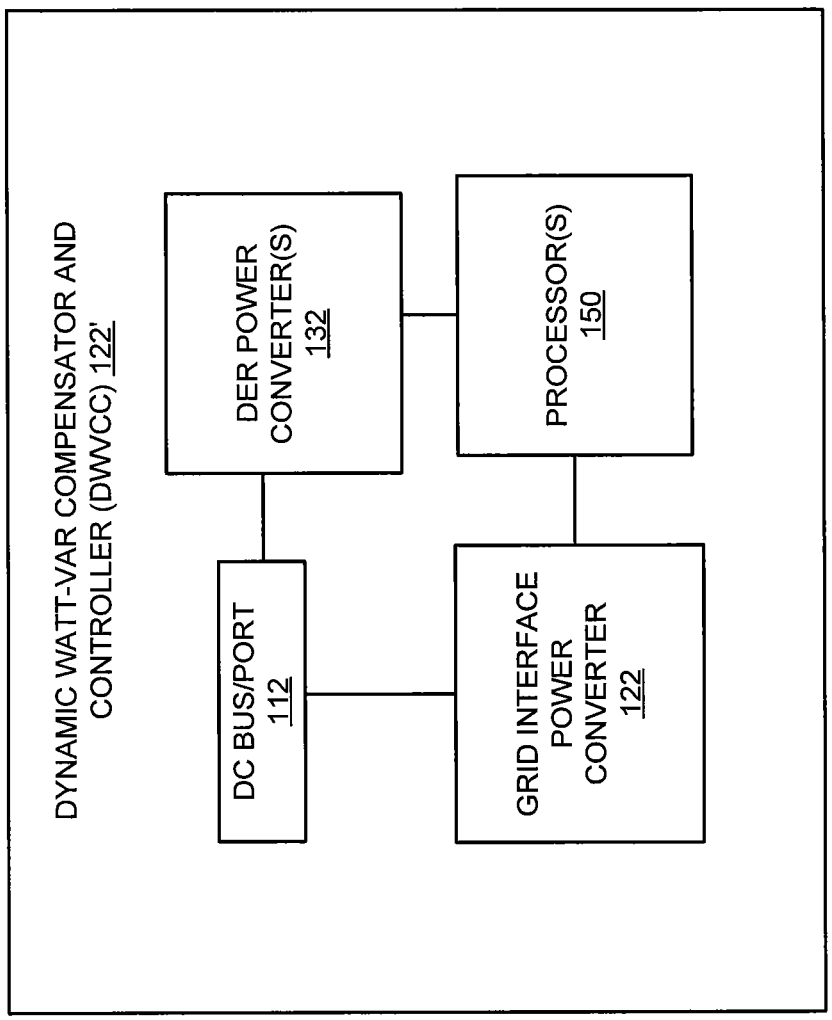
FIG. 1F is a block diagram of a dynamic Watt-VAR compensator and controller (DWVCC), according to various embodiments.

Referring now to FIG. 1F, the grid interface power converter 122, which is coupled to the DC bus 112 and to the AC bus, may include circuitry that is configured to operate in either a power inverter mode or a power rectifier mode, depending on the direction of power flow. In particular, the grid interface power converter 122 may be configured to operate in the power inverter mode when it receives DC power, and in the power rectifier mode when it receives AC power. The power inverter mode and the power rectifier mode may be controlled by one or more processors 150 coupled to, or included in, the grid interface power converter 122. The processor(s) 150 may be either internal or external to the power electronics circuitry 102. The combination of the processor(s) 150, the grid interface power converter 122, and the DER power converter(s) 132 may be referred to herein as a DWVCC 122'. Moreover, the grid interface power converter 122 and the DER power converter(s) 132, either with or without the processor(s) 150, may be referred to herein as a "compensator" or a "dynamic Watt-VAR compensator." In some embodiments, the AC PCC, which is the point on the AC grid 100 to which the DWVCC 122' is connected, may be outside of the housing 106 of the premise energy router PER, whereas the DC bus 112 may be inside the housing 106.

When operating in the power inverter mode, the grid interface power converter 122 can use the DC voltage at the DC bus 112 to provide any AC output, without using an AC transformer. For example, software control via the processor(s) 150, including software-definable AC voltage levels, of the DC bus 112 may eliminate the need for an AC transformer. Accordingly, regardless of whether the DC voltage at the DC bus 112 is 24 Volts or 2,000 Volts, the power inverter mode of the grid interface power converter 122 can output a desired AC voltage, such as 120 Volts, 240 Volts, or 480 Volts. Moreover, the grid interface power converter 122 may be single-phase, split-phase, or three-phase circuitry, and may be referred to herein as a "bidirectional power converter" because it may be configured to operate both as an AC-to-DC rectifier and as a DC-to-AC inverter. Accordingly, in some embodiments, the hardware of the grid interface power converter 122 may be referred to herein as "bidirectional inverter-rectifier circuitry," which is configured to perform both inverter and rectifier functionality (e.g., configured to selectively perform one of the two functionalities in response to the direction of power flow).

Figure 1G:
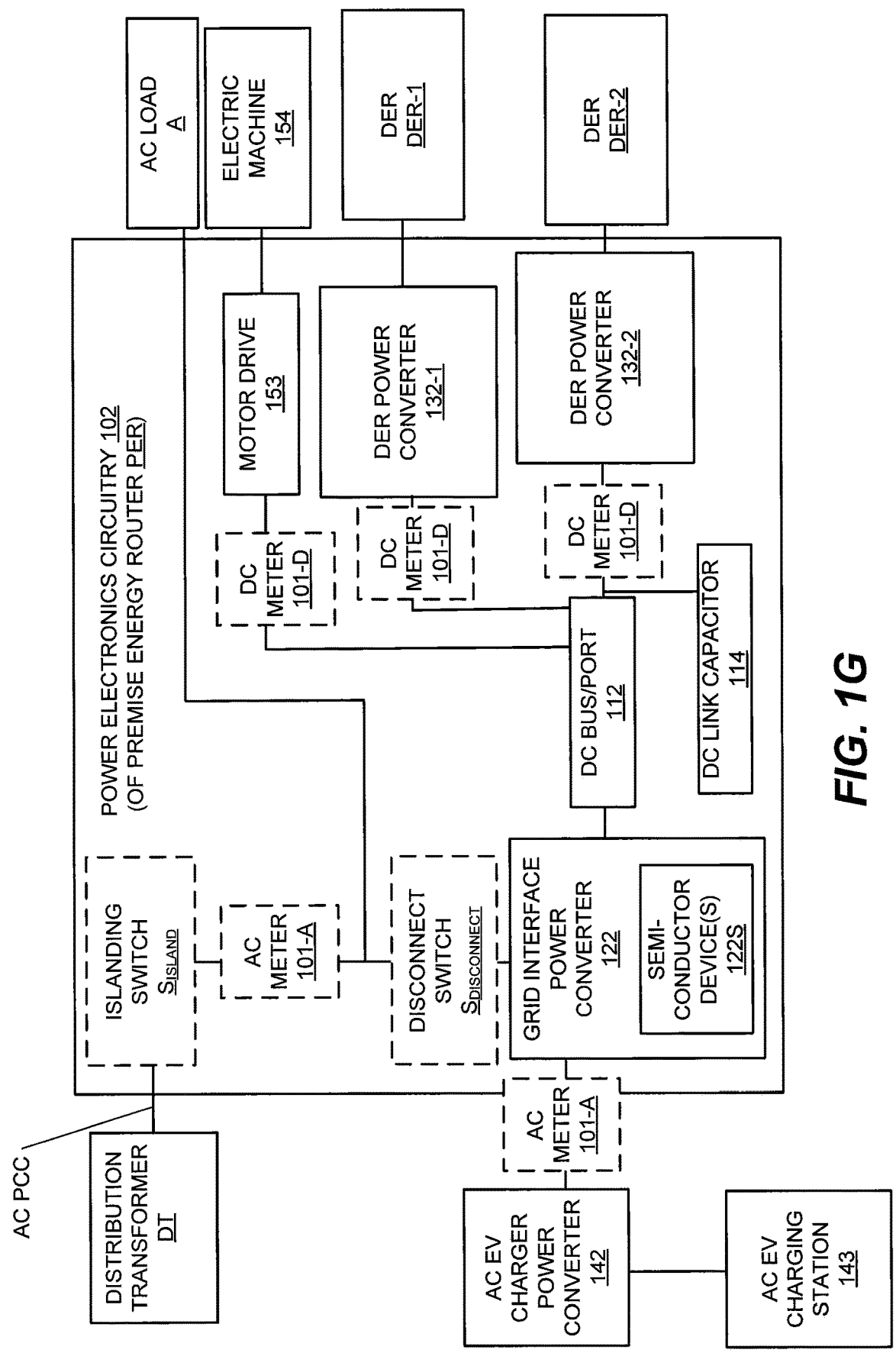
FIG. 1G is a block diagram of power electronics circuitry of a premise energy router, according to various embodiments.

Referring now to FIG. 1G, a block diagram is provided that illustrates a further detailed example of the power electronics circuitry 102 of FIG. 1E. As illustrated in this example, the DC bus 112 may be a shared DC bus that is coupled to a plurality of the distributed energy resources DERs via their respective DER power converters 132. In particular, FIG. 1G illustrates a first DER power converter 132-1 that is coupled to a first distributed energy resource DER-1, and a second DER power converter 132-2 that is coupled to a second distributed energy resource DER-2.

The distributed energy resources DER-1 and DER-2 may (i) both be DC power generation elements, (ii) both be DC energy storage elements, or (iii) be a DC power generation element and a DC energy storage element, respectively. Accordingly, the distributed energy resources DER-1 and DER-2 may be referred to herein as a plurality of "DC power generation and/or DC energy storage elements." Examples of DC power generation elements include a solar PV device/system, a fuel cell, and a DC generator. Moreover, examples of DC energy storage elements include a battery device/system, a fast DC EV charger (e.g., a Level 3 charger), a super/ultra-capacitor, and a flywheel.

The shared DC bus 112 may be configured to receive DC power from the distributed energy resources DER-1 and DER-2. For example, the first distributed energy resource DER-1 may be a DC power generation element such as a solar PV system or a fuel cell, and the second distributed energy resource DER-2 may be a DC energy storage element such as a battery or a capacitor. Moreover, the grid interface power converter 122 may be configured to convert, using the power inverter mode, this DC power into AC power. The grid interface power converter 122, when operating in the power inverter mode, may be further configured to inject current to the AC PCC, which may be a PCC that is between (a) the AC grid 100 to which the premise energy router PER is coupled and (b) a load (e.g., an AC load A) of the customer premise 120. Accordingly, the grid interface power converter 122 can inject current into the AC grid 100. For example, the grid interface power converter 122 can inject current to serve both (a) the AC grid 100 and (b) the load of the customer premise 120, as excess current can go to the AC grid 100 when the grid interface power converter 122 injects more current than the load can handle. The injected current may include a combination of direct harmonic current and quadrature current. As an example, the injected current may include a combination of (i) direct fundamental and harmonic current and (ii) quadrature fundamental and harmonic current.

Because the premise energy router PER includes the grid interface power converter 122 that is configured to operate in the power inverter mode, the premise energy router PER does not need to rely on, and thus may be free of, any step-up or step-up down AC transformer. Moreover, when the grid interface power converter 122 is coupled to the shared DC bus 112 of both (i) a solar PV and (ii) a battery, the grid interface power converter 122 operating in the power inverter mode may provide significant supply capacity. An inverter that is only coupled to a capacitor, on the other hand, may not provide much supply capacity, as it may be limited to leveraging VARs from the capacitor. Also, in the example of the solar PV and the battery, the grid interface power converter 122 may regulate power flow from the solar PV into the grid 100 via the DC bus 112 or into the battery via the DC bus 112. Furthermore, by using the common/shared grid interface power converter 122 including the power inverter mode for all DC generation and storage elements, the use of different respective inverters for the DC generation and storage elements can be avoided.

The premise energy router PER may also be free of any mechanical circuit breaker, as the grid interface power converter 122 may include one or more power semiconductor devices 122S that are configured to switch at a frequency of 10 kilohertz or higher. The power semiconductor devices 122S are high-speed bidirectional devices that may perform the functions of high-speed relays and may mitigate fault conditions in the grid interface power converter 122 and a DC-to-DC converter coupled thereto. Aside from these bidirectional semiconductor devices, the premise energy router PER may not use any other current interruption and isolation device, such as AC or DC circuit breakers. In some embodiments, a bidirectional semiconductor device may be provided by a combination of two unidirectional semiconductor devices. The grid interface power converter 122 (e.g., the inverter mode thereof) may also provide sufficient isolation that no auxiliary transformer may be needed between the grid interface power converter 122 and the grid 100 for galvanic isolation.

The example of FIG. 1G also illustrates a DC link capacitor 114 that is coupled to the DC bus 112 and to the second distributed energy resource DER-2. For example, the DC link capacitor 114 may be used when the second distributed energy resource DER-2 is a battery energy storage system/device. As an alternative to the DC link capacitor 114, a bank of capacitors may be coupled between the DC bus 112 and the battery energy storage system/device.

When the second distributed energy resource DER-2 is an energy storage system/device, such as a battery or an ultra-capacitor, the DER power converter 132-2 coupled thereto may be configured to insert synthetic inertia into the electric grid 100. In particular, the DER power converter 132-2 may insert synthetic inertia into a distribution portion (e.g., a 480 Volts AC or lower portion) of the electric grid 100, which portion may be referred to herein as a "distribution grid." The synthetic inertia is provided by the combined operation of (a) the inverter mode of the grid interface power converter 122 and (b) the DER power converter 132-2, which is a DC-to-DC converter that emulates a high value of capacitance. Moreover, this DER power converter 132-2 may be referred to herein as an "energy storage power converter," an "energy storage DC-to-DC converter," or, when it has switched mode functionality, an "energy storage switched mode power converter." In some embodiments, a battery that is coupled to the DER power converter 132-2 may include a battery management system that may communicate with the DER power converter 132-2.

The DER power converters 132-1 and 132-2 may communicate with each other, and/or with the grid interface power converter 122, via a field message bus. Such field message bus communications may control the power converters 122, 132 in a coordinated manner. For example, the communications circuitry 103 may be coupled to the power electronics circuitry 102 and may be configured to provide communications, via the field message bus, between components of the power electronics circuitry 102 such as the DER power converters 132-1 and 132-2. As an example, the field message bus may coordinate communications, via the communications circuitry 103, between the grid interface power converter 122, a solar PV power converter, and a battery power converter.

The meter circuitry 101 of the premise energy router PER may include AC meter circuitry 101-A that is configured to measure real and reactive AC power, and DC meter circuitry 101-D that is configured to measure DC power. The AC meter circuitry 101-A and the DC meter circuitry 101-D may be coupled to power-flow paths of various components of the power electronics circuitry 102. For example, the DER power converters 132-1 and 132-2 may have DC meter circuitry 101-D coupled thereto. As another example, the power electronics circuitry 102 may include a motor drive 153 having DC meter circuitry 101-D coupled thereto. Although this DC meter circuitry 101-D is illustrated as coupled to an output of the motor drive 153 that is inside the power electronics circuitry 102, it will be understood that the DC meter circuitry 101-D itself may be outside of the power electronics circuitry 102, as indicated by broken line in FIG. 1G. The motor drive 153 may include one or more electric motor drives, such as AC variable frequency drives (VFD) and brushless DC (BLDC) motor drives with regenerative braking/stop capability.

For simplicity of illustration, a few examples of the DC meter circuitry 101-D are illustrated in FIG. 1G. It will be understood, however, that various sensors (e.g., voltage and/or current sensors) inside the housing 106 of the premise energy router PER may be coupled to various components of the power electronics circuitry 102 to measure DC power.

Similarly, although FIG. 1G illustrates an example of the AC meter circuitry 101-A that is coupled to a node/location between an islanding switch $S_{ISLAND}$ and a disconnect switch $S_{DISCONNECT}$ to measure how much AC power is supplied to an AC load A, it will be understood that various sensors inside the housing 106 may be coupled to various components inside or outside of the power electronics circuitry 102 to measure real and reactive AC power. For example, AC meter circuitry 101-A may be coupled to a path of power flow between the grid interface power converter 112 and an AC EV charger power converter 142. As another example, the motor drive 153 may be coupled to an electric machine 154 that is at the customer premise 120, and the motor drive 153 and the electric machine 154 may have AC meter circuitry 101-A therebetween. In some embodiments, the electric machine 154 may include diagnostics that communicate with the motor drive 153. Examples of the electric machine 154 include an induction motor, a synchronous motor, and a brushless DC motor. Moreover, AC meter circuitry 101-A may be coupled to a path of power flow between the AC PCC and the islanding switch $S_{ISLAND}$ of the premise energy router PER.

As with the DC meter circuitry 101-D, it will be understood that the AC meter circuitry 101-A may be outside of, yet coupled to, the power electronics circuitry 102, as indicated by broken line in FIG. 1G. All of the AC meter circuitry 101-A and DC meter circuitry 101-D may be inside the housing 106 of the premise energy router PER.

The islanding switch $S_{ISLAND}$ may be a bidirectional switch that is coupled to an AC side of the grid 100. Moreover, the islanding switch $S_{ISLAND}$ may be one among a plurality of switches S (FIG. 1B) that are inside the housing 106 of the premise energy router PER. For example, the premise energy router PER may further include the disconnect switch $S_{DISCONNECT}$, which may be a bidirectional switch that is coupled to the secondary side of the distribution transformer DT. As an example, the disconnect switch $S_{DISCONNECT}$ may be coupled to a low-voltage secondary service connection 107 (FIG. 1B). Although the disconnect switch $S_{DISCONNECT}$ is also coupled downstream to components among the power electronics circuitry 102, it will be understood that the islanding switch $S_{ISLAND}$ and the disconnect switch $S_{DISCONNECT}$ may themselves be outside of the power electronics circuitry 102.

The AC load A may be coupled to a node/location between the islanding switch $S_{ISLAND}$ and the disconnect switch $S_{DISCONNECT}$, which is a protection mechanism to keep the AC load A supplied by the AC grid 100. Accordingly, the disconnect switch $S_{DISCONNECT}$ does not disconnect the AC load A, which is the aggregate AC load of the customer premise 120 and thus may be, for example, a residential load including a house, air conditioner, washer/dryer, etc. Rather, the AC load A remains connected to the distribution transformer DT via the islanding switch $S_{ISLAND}$, which can island the AC load and every component that is downstream from the disconnect switch $S_{DISCONNECT}$. The disconnect switch $S_{DISCONNECT}$ can, however, disconnect an AC EV charging station 143 that is at the customer premise 120 from the premise energy router PER. The AC EV charging station 143, which may be a Level 1 or Level 2 EV charging station, is coupled to the AC EV charger power converter 142. The disconnect switch $S_{DISCONNECT}$ also disconnects the grid interface power converter 122 from the distribution transformer DT.

Referring now to FIGS. 2A-2L, flowcharts are provided illustrating operations of an apparatus, such as a premise energy router PER, according to various embodiments. The operations may be performed while the apparatus (e.g., the premise energy router PER) is connected between a utility secondary service 107 (FIG. 1B) of an electric utility and a wiring connection 104 (FIG. 1B) of a customer at a premise 120 (FIG. 1A) of the customer. For example, the operations of FIGS. 2A-2L may be performed while the apparatus is downstream from a substation 140 (FIG. 1A) that serves the premise 120 and without using any step-up or step-down AC transformer in the apparatus. As an example, the operations of FIGS. 2A-2L may be performed while the apparatus is at or adjacent (e.g., within about 300 feet of) a residential premise of the customer.

Figure 2A:
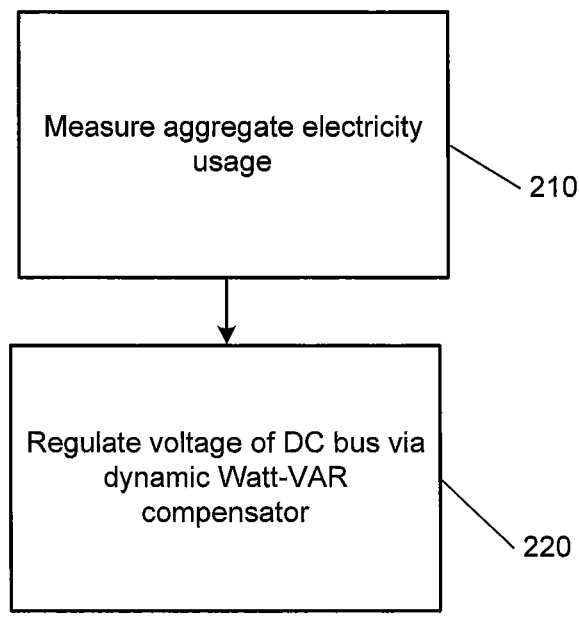
FIGS. 2A-2L are flowcharts illustrating operations of a premise energy router, according to various embodiments.

As shown in FIG. 2A, the operations may include measuring (Block 210), using AC meter circuitry 101-A and/or DC meter circuitry 101-D of the electric utility meter circuitry 101 of the apparatus, usage of electricity supplied by the electric utility to the premise 120 of the customer. As an example, the operation(s) of Block 210 may include performing measurements in kilowatt hours or in other units of measurement of energy used. The operation(s) of Block 210 may measure an aggregate (e.g., overall) power consumption at the customer premise 120. In some embodiments, the aggregate power consumption may be the total power consumed by the AC load A, as measured by the AC meter circuitry 101-A that is coupled to the AC load A. Alternatively, the aggregate power consumption may be the total power consumption measured by each instance of AC meter circuitry 101-A and DC meter circuitry 101-D in the premise energy router PER. Also, in some embodiments, the power electronics circuitry 102 may be unmetered so that it does not affect a customer's energy consumption. For example, the premise energy router PER may include an AC bus bar (FIG. 1B) that is independently connected between the utility secondary service 107 of the electric utility and each of the electric utility meter circuitry 101 and the power electronics circuitry 102.

FIG. 2A further illustrates that the operations may include regulating (Block 220), using a grid interface power converter 122 of the DWVCC 122' (FIG. 1F) of the apparatus, a voltage of a DC bus 112 in the apparatus. Although Block 220 is illustrated as occurring after Block 210, it will be understood that the operation(s) of Block 220 may additionally or alternatively be performed during and/or before the operation(s) of Block 210.

Figure 2B:
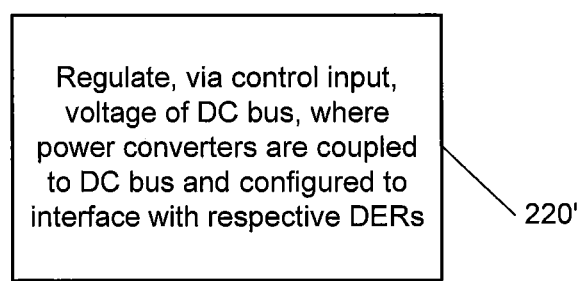

Moreover, as shown in FIG. 2B, the measuring (Block 210) operation(s) may, in some embodiments, be omitted or performed independently of the regulating (Block 220) operation(s). Also, Block 220' of FIG. 2B illustrates that the regulating (Block 220) operation(s) may be performed in response to a control input. For example, a processor 150 may provide a control input to the grid interface power converter 122 to regulate the voltage of the DC bus 112.

Furthermore, referring again to FIG. 1G, the apparatus that performs the operation(s) of Block 220' of FIG. 2B may include DER power converters 132-1, 132-2 that share the DC bus 112 and are configured to interface with respective distributed energy resources DER-1, DER-2. For example, the operation(s) of Block 220' may include operating the power inverter mode of the grid interface power converter 122 that is coupled to the shared DC bus 112 and is shared by the distributed energy resources DER-1, DER-2. Additionally or alternatively, the operation(s) of Block 220' may include operating a power rectifier mode of the grid interface power converter 122 that is coupled to the shared DC bus 112 and is shared by the distributed energy resources DER-1, DER-2. The shared rectifier mode may help to improve supply.

Figure 2C:
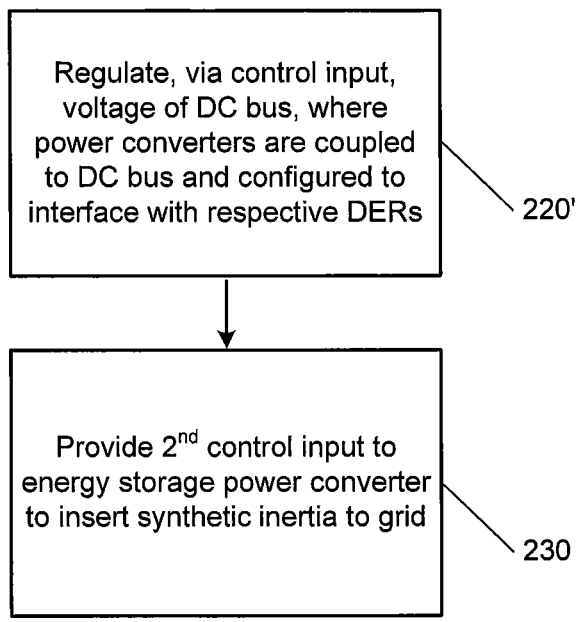

Referring now to FIG. 2C, operations of the apparatus may include inserting synthetic inertia to the grid 100. Any energy storage device, such as a capacitor or a battery, can support synthetic inertia. When the distributed energy resource DER-2 is an energy storage device, the DER power converter 132-2 coupled thereto may be referred to herein as an "energy storage power converter" or, when it provides switched mode functionality, as an "energy storage switched mode power converter." In addition to the control input that is provided in Block 220', operations of the apparatus may include providing (Block 230) a further (e.g., second) control input to the energy storage power converter 132-2 to insert synthetic inertia to a distribution portion of the grid 100. For example, the control input (e.g., from a processor 150) of Block 230 may control capacitor emulation via the energy storage power converter 132-2 to insert the synthetic inertia.

Figure 2D:
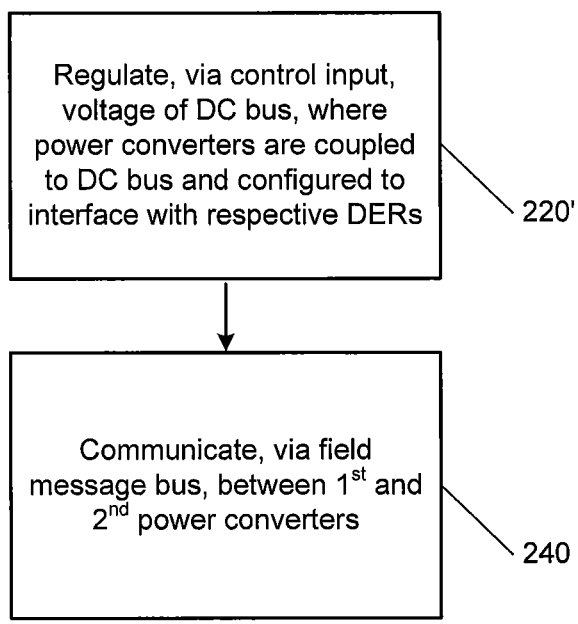

Referring now to FIG. 2D, operations of the apparatus may include communicating (Block 240), via a field message bus, between the DER power converters 132-1 and 132-2. Additionally or alternatively, the communicating (Block 240) may be performed between the grid interface power converter 122 and one or both of the DER power converters 132-1 and 132-2. In some embodiments, the communicating (Block 240) may be performed via the communications circuitry 103. Moreover, although shown in FIG. 2D, the communicating (Block 240) may be performed in any of FIGS. 2A-2L, and may be performed before, during, and/or after the regulating (Block 220/220') operation(s). In some embodiments, the communicating (Block 240) may include transmitting software controls and/or configuration settings via the field message bus.

Figure 2E:
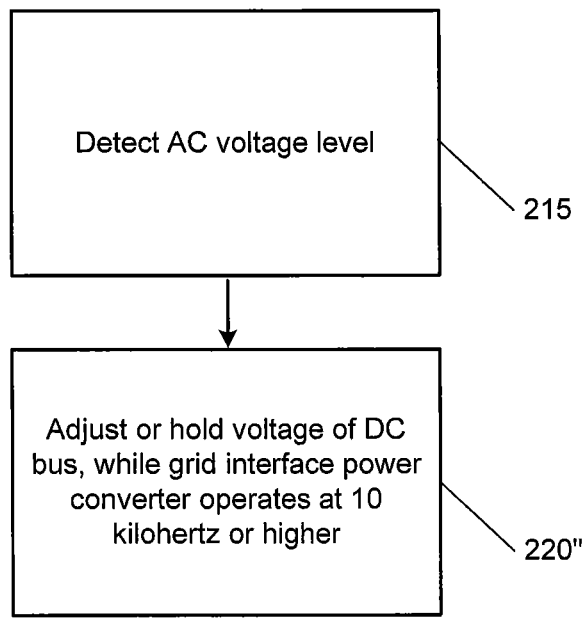

Referring now to FIG. 2E, the regulating operation(s) of Block 220' may include operating the grid interface power converter 122 of the apparatus to adjust or hold (Block 220") the voltage of the DC bus 112. For example, the control input of Block 220' may include a command to the grid interface power converter 122 to adjust or hold the voltage of the DC bus 112. As an example, the command may be provided in response to an AC voltage level that is detected (Block 215) by the apparatus. In particular, upon detecting an AC voltage change, it may be desirable to adjust the DC voltage accordingly. Moreover, in some embodiments, the adjusting or holding (Block 220") may be performed by the grid interface power converter 122 while operating at a switching frequency of 10 kilohertz or higher.

Figure 2F:
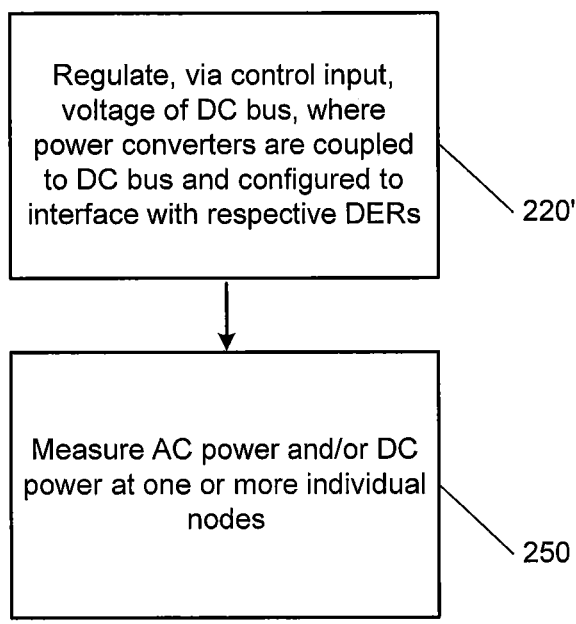

Referring now to FIG. 2F, operations of the apparatus may include performing AC and/or DC power measurements (Block 250), using AC meter circuitry 101-A and/or DC meter circuitry 101-D of the utility meter circuitry 101. For example, the power measurement(s) of Block 250 may include operating DC meter circuitry 101-D (FIG. 1G) of the apparatus to measure DC power, as well as operating AC meter circuitry 101-A (FIG. 1G) of the apparatus to measure real and reactive AC power. Such measurement(s) may be performed at one or more individual nodes in FIG. 1G. As an example, the measurement(s) may be performed by the AC meter circuitry 101-A that is coupled to the AC EV power converter 142, while omitting measurement(s) at one or more other nodes in FIG. 1G. In some embodiments, the operation(s) of Block 250 may be combined with the measuring operation(s) of Block 210 (FIG. 2A). For example, the operation(s) of Block 250 may include measuring total power consumption by the AC load A and/or measuring power consumption at each measured node in FIG. 1G, to provide the aggregate measurement of Block 210.

Figure 2G:
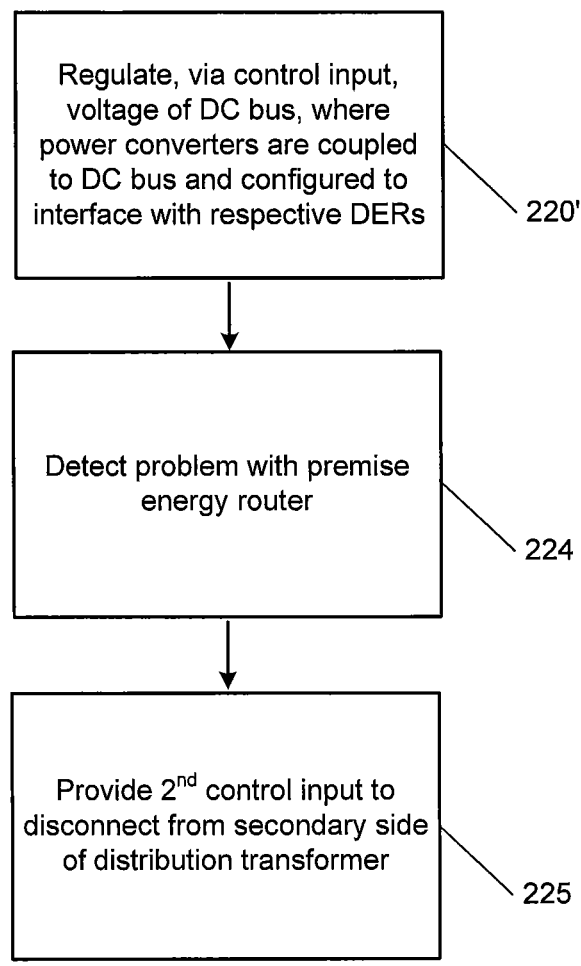

Referring now to FIG. 2G, operations of the apparatus may include providing (Block 225) a further (e.g., second) control input to the disconnect switch $S_{DISCONNECT}$ to disconnect the apparatus from the secondary side of the distribution transformer DT. For example, a processor 150 may provide this control input in response to detecting (Block 224) a problem with the apparatus. As an example, in the event of an issue (e.g., a fault) with the premise energy router PER, such as an issue with the power electronics circuitry 102, the disconnect switch $S_{DISCONNECT}$ may trip off the premise energy router PER, which may protect the customer from losing power at the premise 120.

Figure 2H:
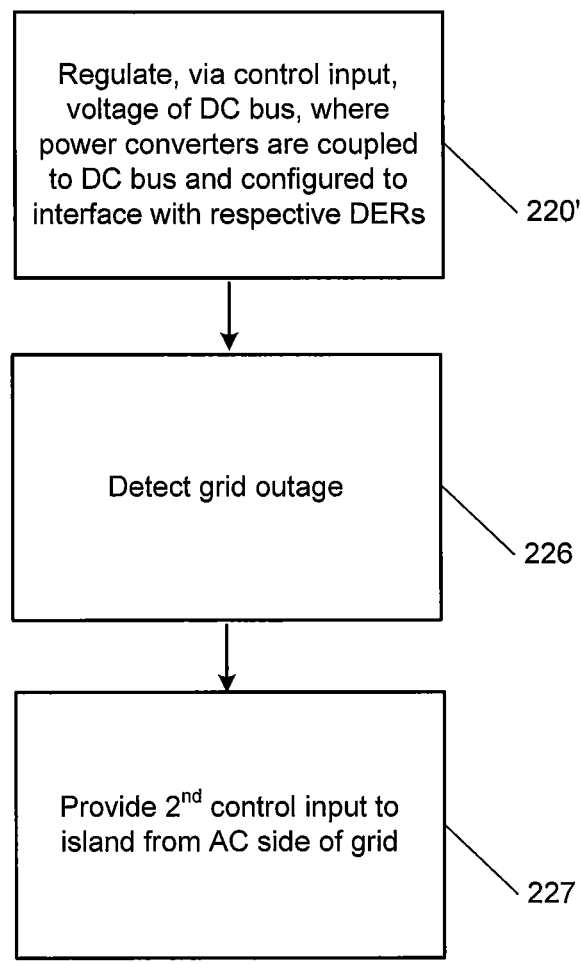

Referring now to FIG. 2H, in addition to, or as an alternative to, the operations of Blocks 224 and 225, the operations of the apparatus may include providing (Block 227) a further (e.g., second or third) control input to the islanding switch $S_{ISLAND}$ to island the apparatus from the AC side of the grid 100. For example, a processor 150 may provide this control input in response to detecting (Block 226) an outage of the grid 100. Accordingly, the islanding switch $S_{ISLAND}$ can isolate the customer in the event of a grid outage.

The switches $S_{DISCONNECT}$ and $S_{ISLAND}$ may be bidirectional switches, which may be controlled by any microcontroller, such as a processor 150, that controls one or more of the power converters 122, 132, 142. Unlike switched mode power converters, which may include the power semiconductor devices 122S, however, the switches $S_{DISCONNECT}$ and $S_{ISLAND}$ may not operate at 10 kilohertz (or higher) on an ongoing basis. It will be understood that any of the power converters 122, 132, and 142 may include at least one power semiconductor device 122S that operates at a switching frequency of 10 kilohertz or higher.

Figure 2I:
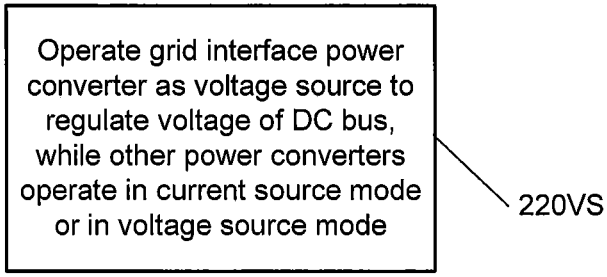

Referring now to FIG. 2I, the regulating operation(s) of Block 220/220' may include operating (Block 220VS) the grid interface power converter 122 as a voltage source to regulate the voltage of the DC bus 112. While the grid interface power converter 122 is operating (Block 220VS) as a voltage source, the DER power converters 132 may operate in a current source mode or in a voltage source mode. For example, all power converters 122, 132, 142 can concurrently operate as a voltage source. Moreover, operations of the premise energy router PER may include dynamically selecting (e.g., via the processor(s) 150) whether one or more of the power converters 122, 132, 142 operates as a voltage source.

Figure 2J:
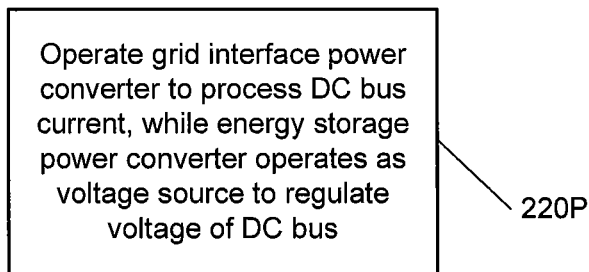

Referring now to FIG. 2J, the regulating operation(s) of Block 220/220' may include operating (Block 220P) the grid interface power converter 122 to process current into and out of the DC bus 112, while an energy storage power converter (e.g., the DER power converter 132-2) operates as a voltage source to regulate the voltage of the DC bus 112.

Figure 2K:
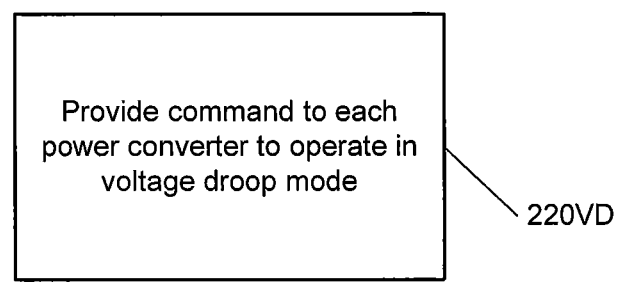

Referring now to FIG. 2K, the regulating operation(s) of Block 220/220' may include providing (Block 220VD) a command to each of the power converters 122 and 132 to operate in a voltage droop control mode, which may improve system stability. As an example, one or more processors 150 may provide this command to the power converters 122 and 132. Moreover, it will be understood that the voltage droop control mode may operate concurrently with the operation(s) of any other block of FIGS. 2A-2L.

Figure 2L:
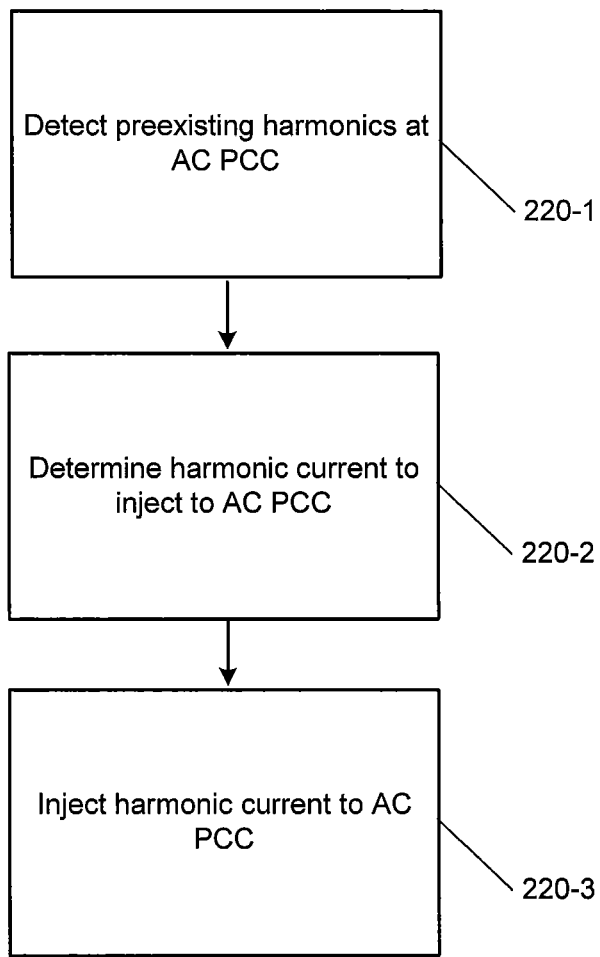

Referring now to FIG. 2L, the regulating operation(s) of Block 220/220' may include injecting active or reactive current (Block 220-3) from the grid interface power converter 122 to the AC PCC. Such current injection may mitigate preexisting harmonics at the AC PCC. For example, the apparatus may detect (Block 220-1), using the meter circuitry 101 and/or the power electronics circuitry 102, preexisting harmonics at the AC PCC. The apparatus may then determine (Block 220-2), using a processor 150, whether to inject harmonic current to the AC PCC. This may include determining what frequency and/or magnitude of harmonic current to inject to compensate for the preexisting harmonics. Accordingly, the operation(s) of Block 220-3 may be performed in response to the operation(s) of Block 220-1 and/or Block 220-2, and may include injecting harmonic current to mitigate the preexisting harmonics. In particular, the grid interface power converter 122, using the inverter mode, may perform the operation(s) of Block 220-3 in response to the result of Block 220-1 and/or Block 220-2.

The grid interface power converter 122 may provide voltage support/regulation at the AC PCC by actively (a) injecting or consuming reactive power, (b) injecting or consuming real power, or (c) a combination of (a) and (b). The grid interface power converter 122 may inject or consume reactive power on its own, whereas real power may involve DC power generation and/or storage elements. For example, when real power is consumed from the AC PCC, it may be stored in a battery. Moreover, real power that is to be injected into the AC PCC may be taken put of a solar PV or a battery. Accordingly, the grid interface power converter 122 is not limited to absorbing reactive power, but rather may add or remove real or reactive power to hold the voltage constant at the AC PCC. Such regulation/control of Watt injection and/or consumption and VAR injection and/or consumption may increase the size of the operating region that the grid interface power converter 122 may use/select. Energy storage devices, or other DC generation/storage devices connected to the DC bus 112, may enable this regulation/control.

While the grid interface power converter 122 is performing the operations of FIG. 2L, or performing the regulating operation(s) of any other of the FIGS. 2A-2L, the grid interface power converter 122 may be coupled to the DC bus 112, whose voltage may be at any level from 24 Volts to 2,000 Volts during the operations. Moreover, a switching frequency of the grid interface power converter 122 (e.g., of one or more power semiconductor devices 122S thereof) may be 10 kilohertz or higher while performing the regulating operation(s) of any of the FIGS. 2A-2L. Such fast switching may provide/improve fault protection, without employing conventional fault protection devices, such as AC and DC mechanical circuit breakers.

The regulating operation(s) of FIGS. 2A-2L may be performed automatically/autonomously (without control input from outside the apparatus) or may be performed remotely via control input received via the communications circuitry 103. For example, an adjustment to the voltage at the DC bus 112 may be determined/commanded by a localized communication node in the field or at a centralized operations center, such as a utility data center including a head end. As an example, a user at the utility data center may use a secure Web interface to conduct/command the adjustment.

In some embodiments, the apparatus, which may be the premise energy router PER illustrated in FIGS. 1A and 1B, may connect to an existing house secondary service (e.g., a wiring connection 104 of the customer) and an existing utility secondary service (e.g., the low-voltage secondary service connection 107) on the house. The premise energy router PER may provide utility meter functionality, via the meter circuitry 101, and thus may replace an existing utility meter (and may optionally replace a meter base) on the house. For example, the premise energy router PER may be mountable on the side of the house, and may have a housing 106 that is no larger than twenty (20) inches wide, twelve (12) inches deep, and twenty-four (24) inches long (in terms of vertical height). As an example, an existing utility meter may be removed, and the premise energy router PER may be installed at the location where the utility meter had been before it was removed. The weight of the premise energy router PER may be forty (40) pounds or lighter (and, in some embodiments, thirty (30) pounds or lighter), such that one person can install the premise energy router PER.

Moreover, the DC bus 112, which may be inside the premise energy router PER and may be coupled to one or more DC loads, may provide a DC power source into the customer's home and/or may receive DC inputs. For example, in some embodiments, the DC bus 112 may both (a) receive a 400-Volt DC input (e.g., from a solar device or a battery storage) and (b) provide a 400-Volt DC output to a DC load (e.g., an electric vehicle charging station). By receiving DC inputs, the DC bus 112 may accelerate the use of distributed energy resources (e.g., DC loads such as solar panels, wind energy devices, battery storage devices, electric vehicles, etc.) because the DC bus 112 can obviate the need for a separate inverter, thus saving customers money. Also, the premise energy router PER may follow such DC loads closely and may sustain a steady voltage level despite environmental factors such as a cloud moving over a solar generator.

In contrast with a static compensator, a DWVCC 122' according to various embodiments herein may provide enhanced control, including management/regulation of the DC bus 112. Moreover, in contrast with centralized bulk devices at a plant or a substation, a premise energy router PER, which may include a DWVCC 122', according to various embodiments herein may use hardware that is at or adjacent the customer premise 120 (e.g., at or adjacent the load). For example, the premise energy router PER may not only provide grid support, but also may integrate directly on the DC bus 112 of DC storage and/or generation elements DER and may supply capacity. As an example, the rectifier mode of the grid interface power converter 122 may help to enhance supply (e.g., from DC generation and/or storage elements DER on the DC bus 112) and may harmonize with what is demanded/needed on the AC power system.

In some embodiments, the premise energy router PER may provide synthetic inertia, which may improve power quality and system resiliency. Inverters, such as the inverter functionality of the grid interface power converter 122, can reduce overall inertia. The premise energy router PER, however, can use software and the power electronics circuitry 102 to artificially insert inertia to match the grid 100. Moreover, in some embodiments, the premise energy router PER may use synthetic inertia to jumpstart the grid 100 after an outage of the grid 100. Such jumpstarting may be similar to jumpstarting the grid 100 with a generator.

Moreover, in some embodiments, the premise energy router PER may be provided as a retrofit solution that interfaces with an existing (e.g., third party) inverter, which may not otherwise have access to a DC bus. In such embodiments, the grid interface power converter 122 may be outside of the housing 106 of the premise energy router PER. The DC bus 112 and the power converters 132, however, may still be inside the housing 106 and may be connected to the grid interface power converter 122 that is outside of the housing 106. For example, the grid interface power converter 122 that is outside the housing 106 may include a solar PV inverter that is coupled to a solar PV system. The solar PV system may be connected to the DC bus 112 via one of the power converters 132 that is inside the housing 106. Accordingly, although FIGS. 1E and 1G illustrate a grid interface power converter 122 that is inside the housing 106, the grid interface power converter 122 may alternatively be an existing, third-party device that is outside of the housing 106 and that may be coupled to the DC bus 112 that is inside the housing 106 to provide a retrofit solution.

Specific example embodiments of the present inventive concepts are described herein with reference to the accompanying drawings. The present inventive concepts may, however, be embodied in a variety of different forms and should not be construed as limited to the embodiments set forth herein. Rather, these embodiments are provided so that this disclosure will be thorough and complete and will fully convey the scope of the present inventive concepts to those skilled in the art. In the drawings, like designations refer to like elements. It will be understood that when an element is referred to as being "connected," "coupled," or "responsive" to another element, it can be directly connected, coupled or responsive to the other element or intervening elements may be present. Furthermore, "connected," "coupled," or "responsive" as used herein may include wirelessly connected, coupled, or responsive.

The terminology used herein is for the purpose of describing particular embodiments only and is not intended to be limiting of the present inventive concepts. As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. The symbol "/" is also used as a shorthand notation for "and/or."

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will also be understood that although the terms "first" and "second" may be used herein to describe various elements, these elements should not be limited by these terms. These terms are only used to distinguish one element from another element. Thus, a first element could be termed a second element, and similarly, a second element may be termed a first element without departing from the teachings of the present inventive concepts.

Example embodiments of the present inventive concepts may be embodied as nodes, devices, apparatuses, and methods. Accordingly, example embodiments of the present inventive concepts may be embodied in hardware and/or in software (including firmware, resident software, microcode, etc.). Furthermore, example embodiments of the present inventive concepts may take the form of a computer program product comprising a non-transitory computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Example embodiments of the present inventive concepts are described herein with reference to flowchart and/or block diagram illustrations. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means and/or circuits for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the functions specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

In the specification, various embodiments of the present inventive concepts have been disclosed and, although specific terms are employed, they are used in a generic and descriptive sense only and not for purposes of limitation. Those skilled in the art will readily appreciate that many modifications are possible for the disclosed embodiments without materially departing from the teachings and advantages of the present inventive concepts. The present inventive concepts are defined by the following claims, with equivalents of the claims to be included therein.

What is claimed is:

1. A Premise Energy Router (PER) at or adjacent a premise of a customer of an electric utility, the PER comprising:
    a housing;
    a Direct Current (DC) bus in the housing; and
    a plurality of switched mode DC-to-DC power converters in the housing, coupled to the DC bus, and configured to interface with a plurality of Distributed Energy Resources (DERs), respectively, at the premise of the customer,
    wherein each of the plurality of switched mode DC-to-DC power converters has a switching frequency of 10 kilohertz or higher.

2. A Premise Energy Router (PER) at or adjacent a premise of a customer of an electric utility, the PER comprising:
    a housing;
    a Direct Current (DC) bus in the housing; and
    a plurality of switched mode DC-to-DC power converters in the housing, coupled to the DC bus, and configured to interface with a plurality of Distributed Energy Resources (DERs), respectively, at the premise of the customer,
    wherein the plurality of DERs comprises an energy storage device at the premise of the customer,
    wherein the plurality of switched mode DC-to-DC power converters comprises an energy storage switched mode power converter coupled to the DC bus and to the energy storage device, and
    wherein the energy storage switched mode power converter is configured to use the energy storage device to insert synthetic inertia for a distribution grid to which the PER is coupled.

3. The PER of claim 2, wherein the energy storage device comprises an ultracapacitor or a battery.

4. The PER of claim 1, further comprising communications circuitry configured to provide communications, using peer-to-peer communications via a field message bus, between first and second ones of the plurality of switched mode DC-to-DC power converters.

5. The PER of claim 1, further comprising:
    a grid interface switched mode power converter coupled to the DC bus, wherein the grid interface switched mode power converter is configured to adjust or hold a voltage of the DC bus; and
    a bidirectional switch coupled to an Alternating Current (AC) side of a grid.

6. The PER of claim 5, wherein the grid interface switched mode power converter comprises a power semiconductor device that is configured to switch at a frequency of 10 kilohertz or higher.

7. The PER of claim 1, further comprising:
    DC meter circuitry configured to measure DC power; and
    Alternating Current (AC) meter circuitry configured to measure real and reactive AC power.

8. The PER of claim 1, further comprising:
    a bidirectional switch coupled to a secondary side of a distribution transformer; and
    a grid interface switched mode power converter coupled to the DC bus, wherein the grid interface switched mode power converter is configured to adjust or hold a voltage of the DC bus.

9. The PER of claim 1, further comprising a switched mode power converter coupled to an Alternating Current (AC) load.

10. A method of operating a Premise Energy Router (PER) at or adjacent a premise of a customer of an electric utility, the method comprising:
    regulating, via a control input, a voltage of a Direct Current (DC) bus of the PER,
    wherein a plurality of switched mode DC-to-DC power converters are coupled to the DC bus and are configured to interface with a plurality of Distributed Energy Resources (DERs), respectively, at the premise of the customer, and
    wherein the regulating comprises providing a command to each of the plurality of switched mode DC-to-DC power converters to operate in a voltage droop control mode.

11. The method of claim 10,
    wherein the plurality of DERs comprises an energy storage device at the premise of the customer,
    wherein the plurality of switched mode DC-to-DC power converters comprises an energy storage switched mode power converter coupled to the DC bus and to the energy storage device,
    wherein the control input comprises a first control input, and
    wherein the method further comprises providing a second control input to the energy storage switched mode power converter to use the energy storage device to insert synthetic inertia for a distribution grid to which the PER is coupled.

12. The method of claim 11, wherein the providing the second control input comprises controlling capacitor emulation via the energy storage switched mode power converter to insert the synthetic inertia.

13. The method of claim 10, further comprising communicating, using peer-to-peer communications via a field message bus, between first and second ones of the plurality of switched mode DC-to-DC power converters.

14. The method of claim 10,
    wherein the control input comprises a command to a grid interface switched mode power converter of the PER that is coupled to the DC bus to adjust or hold the voltage of the DC bus, and wherein the regulating further comprises providing the command to the grid interface switched mode power converter to operate in the voltage droop control mode.

15. The method of claim 14, wherein the command is provided in response to a detected Alternating Current (AC) voltage level.

16. The method of claim 14, wherein the grid interface switched mode power converter adjusts or holds the voltage while operating at a switching frequency of 10 kilohertz or higher.

17. The method of claim 10, further comprising:
operating DC meter circuitry of the PER to measure DC power; and
operating Alternating Current (AC) meter circuitry of the PER to measure real and reactive AC power.

18. The method of claim 10,
wherein the control input comprises a first control input, and
wherein the method further comprises providing a second control input to a switch to disconnect the PER from a secondary side of a distribution transformer.

19. The method of claim 10,
wherein the control input comprises a first control input, and
wherein the method further comprises providing a second control input to a switch to island the PER from an Alternating Current (AC) side of a grid.

20. The method of claim 10, wherein the regulating comprises operating a grid interface switched mode power converter of the PER as a voltage source to regulate the voltage of the DC bus, while the plurality of switched mode DC-to-DC power converters operates in a current source mode or in a voltage source mode.

21. The method of claim 10, wherein the regulating comprises operating a grid interface switched mode power converter of the PER to process current into and out of the DC bus, while an energy storage switched mode power converter of the plurality of switched mode DC-to-DC power converters operates as a voltage source to regulate the voltage of the DC bus.

22. The PER of claim 1, wherein the plurality of DERs are each outside of the housing.

23. The PER of claim 2, wherein the PER is configured to use the synthetic inertia to jumpstart the distribution grid after an outage of the distribution grid.

* * * * *